United States Patent

Tsutsumi

[11] Patent Number: 6,157,564
[45] Date of Patent: Dec. 5, 2000

[54] SEMICONDUCTOR DEVICE

[75] Inventor: Kazuhito Tsutsumi, Hyogo, Japan

[73] Assignee: Mitsubishi Denki Kabushiki Kaisha, Tokyo, Japan

[21] Appl. No.: 09/519,348

[22] Filed: Mar. 6, 2000

[30] Foreign Application Priority Data

Sep. 8, 1999 [JP] Japan .................................. 11-254487

[51] Int. Cl.[7] .............................. G11C 11/00; H01L 27/11
[52] U.S. Cl. ............................ 365/156; 365/63; 257/369; 257/903; 438/153; 438/154
[58] Field of Search ...................................... 365/154, 156, 365/63; 257/66, 69, 369, 903; 438/153, 154, 238

[56] References Cited

U.S. PATENT DOCUMENTS

| | | | |
|---|---|---|---|
| 5,619,056 | 4/1997 | Kuriyama et al. | 257/369 |
| 5,841,153 | 11/1998 | Kuriyama et al. | 257/69 |
| 5,955,746 | 9/1999 | Kim | 257/69 |
| 5,973,369 | 10/1999 | Hayashi | 257/369 |

FOREIGN PATENT DOCUMENTS

| | | |
|---|---|---|
| 5-235279 | 9/1993 | Japan . |
| 9-134956 | 5/1997 | Japan . |
| 10-229168 | 8/1998 | Japan . |

OTHER PUBLICATIONS

"A Novel 6T–SRAM Cell Technology Designed with Rectangular Patterns Scalable beyond 0.18 μm Generation and Desirable for Ultra High Speed Operation", M. Ishida et al., IEDM98, 1998, pp. 201–204.

*Primary Examiner*—Son Mai
*Attorney, Agent, or Firm*—McDermott, Will & Emery

[57] ABSTRACT

An SRAM is provided in which adjacent contact holes cannot be connected and which can be miniaturized. An SRAM memory cell includes a gate electrode formed on a silicon substrate, and an interlayer insulation film covering the gate electrode. The interlayer insulation film has a contact hole which reaches an active region and a contact hole which reaches the gate electrode. The contact holes are positioned almost in a lattice manner.

13 Claims, 20 Drawing Sheets

SEMICONDUCTOR DEVICE

BACKGROUND OF THE INVENTION

1. Field of the Invention

The present invention relates to static type semiconductor memory devices (hereinafter, referred to as "SRAMs"), and more particularly to an SRAM having a plurality of contact holes.

2. Description of the Background Art

Recently, energy saving and lower voltage operation of semiconductor devices which are contained in a portable apparatus have become important to increase the durability of a battery in the portable apparatus. Thus, the demand for SRAMs capable of lower voltage operation at lower power consumption is increasing. In general, an SRAM memory cell for lower voltage operation is formed of six transistors and a full CMOS type memory cell is usually employed.

FIG. 18 is an equivalent circuit diagram of a conventional SRAM memory cell. Referring to FIG. 18, an SRAM memory cell 600 includes n-type driver transistors 642, 645, p-type load transistors 643, 646, and n-type access transistors 641, 646.

Memory cell 600 is connected to bit lines 651, 656, a word line 661, a power supply node 655, and ground nodes 653, 658. In SRAM memory cell 600, a flip-flop circuit is formed of driver transistors 642, 645 and load transistors 643, 646.

Load transistor 643 has its source region connected to power supply node 655 through a contact hole 625 and its drain region connected to a storage node 663 through a contact hole 624. The gate electrode of load transistor 643 is connected to a storage node 662.

Load transistor 646 has its source region connected to power supply node 655 through a contact hole 630 and its drain region connected to storage node 662 through a contact hole 629. The gate electrode of load transistor 646 is electrically connected to storage node 663.

Driver transistor 642 has its source region connected to ground node 653 through a contact hole 623 and its drain region connected to storage node 663 through a contact hole 622. The gate electrode of driver transistor 642 is connected to storage node 662.

Driver transistor 645 has its source region connected to ground node 658 through a contact hole 628 and its drain region connected to storage node 662 through a contact hole 627. The gate electrode of driver transistor 645 is connected to storage node 663.

The gate electrode of access transistor 641 is connected to word line 661. Access transistor 641 has one source/drain region connected to bit line 651 through a contact hole 621 and the other source/drain region connected to storage node 663 through contact hole 622.

The gate electrode of access transistor 644 is connected to word line 661. Access transistor 644 has one source/drain region connected to bit line 656 though a contact hole 626 and the other source/drain region connected to storage node 662 through contact hole 627.

In the following, a plan view of the conventional SRAM memory cell shown in FIG. 18 will be described with reference to FIG. 19. Referring to FIG. 19, SRAM memory cell 600 includes a pair of load transistors 643, 646, a pair of driver transistors 642, 645, and a pair of access transistors 641, 644.

Access transistor 641 is formed of a pair of n-type impurity regions formed in an active region 601 as well as a gate electrode 661. One of the impurity regions is connected to bit line 651 through contact hole 621, and the other impurity region is connected to a storage node 652 through contact hole 622.

Access transistor 644 is formed of a pair of n-type impurity regions formed in an active region 602 as well as gate electrode 661. One of the impurity regions is connected to bit line 656 through contact hole 626, and the other impurity region is connected to a storage node 657 through contact hole 627 and to a gate electrode 662.

Driver transistor 642 is formed of a pair of n-type impurity regions formed in active region 601 as well as gate electrode 662. One of the impurity regions is connected to ground node 653 through contact hole 623, and the other impurity region is connected to storage node 652 through contact hole 622.

Driver transistor 645 is formed of a pair of n-type impurity regions formed in active region 602 as well as a gate electrode 663. One of the impurity regions is connected to ground node 658 through contact hole 628, and the other impurity region is connected to storage node 657 through contact hole 627 and to gate electrode 662.

Load transistor 643 is formed of a pair of p-type impurity regions formed in an active region 603 as well as gate electrode 662. One of the impurity regions is connected to storage node 652 through contact hole 624 and to gate electrode 663, and the other impurity region is connected to power supply node 655 through contact hole 625.

Load transistor 646 is formed of a pair of impurity regions formed in an active region 604 as well as gate electrode 663. One of the impurity regions is connected to storage node 657 through contact hole 629, and the other impurity region is connected to power supply node 655 through contact hole 630.

FIG. 20 shows a section along line XX—XX in FIG. 19. Referring to FIG. 20, an isolation oxide film 670 is formed on a silicon substrate 600a. At the main surface of silicon substrate 600a, n-type impurity regions 601b, 601c, 602a, and 602b are formed. Impurity regions 601b, 601c are formed in active region 601 in FIG. 19, and impurity regions 602a, 602b are formed in active region 602 in FIG. 19.

Between impurity regions 601b and 601c, gate electrode 662 is formed on silicon substrate 600a with a gate oxide film 662a therebetween. Between impurity regions 602a and 602b, gate electrode 663 is formed on the surface of silicon substrate 600a with a gate oxide film 663a therebetween. Further, gate electrode 662 is formed on impurity region 602b with a gate oxide film 662a therebetween.

An interlayer insulation film 681 is formed to cover silicon substrate 600a. In interlayer insulation film 681, contact hole 623 which reaches impurity region 601c, contact hole 622 which reaches impurity region 601b, contact hole 627 which reaches gate electrode 662, and contact hole 628 which reaches impurity region 602a are formed.

In contact holes 623, 622, 627, and 628, a pad electrode 653a, storage nodes 652, 657, and a pad electrode 658a are respectively formed. An interlayer insulation film 682 is formed on interlayer insulation film 681. In interlayer insulation film 682, contact holes 682a, 682b which reach pad electrodes 653a, 658a are formed. Ground nodes 653, 658 are formed to fill contact holes 682a, 682b. Further, bit lines 651, 656 are formed on interlayer insulation film 682.

FIG. 21 shows a section along line XXI—XXI in FIG. 19. Referring to FIG. 21, n-type impurity regions 601a, 601b are formed at the surface of silicon substrate 600a. Impurity regions 601b, 601c are formed in active region 601 in FIG. 19. Between impurity regions 601b and 601c, gate electrode 661 is formed on silicon substrate 600a with a gate oxide film 661a therebetween.

Gate electrodes 662, 663 are formed on isolation oxide film 670. Gate electrode 663 is formed on a p-type impurity region 603a with gate oxide film 663a therebetween.

Interlayer insulation film 681 is formed to cover silicon substrate 600a. In interlayer insulation film 681, contact holes 621, 622, and 624 which reach impurity regions 601a, 601b, and 603a are formed.

A pad electrode 651a is formed to fill contact hole 621. Storage node 652 is formed to fill contact holes 622, 624 and to cover part of the surface of interlayer insulation film 681.

Interlayer insulation film 682 is formed to cover pad electrode 651a and storage node 652. A contact hole 682c which reaches pad electrode 651a is formed in interlayer insulation film 682. Bit line 651 is formed to fill contact hole 682c.

In the following, a method of manufacturing the SRAM shown in FIGS. 19 to 21 will be described. FIGS. 22 to 25 show a manufacturing process of the SRAM shown in FIGS. 19 to 21, in which FIGS. 22 and 24 correspond to the section shown in FIG. 20 and FIGS. 23 and 25 correspond to the section shown in FIG. 21.

Referring to FIGS. 22 and 23, isolation oxide film 670 is formed at the surface of silicon substrate 600a. On silicon substrate 600a, gate electrodes 661, 662, and 663 are formed with gate oxide films 661a, 662a, and 663a therebetween.

Impurity regions 601a, 601b, 601c, 602a, and 602b are formed by implanting n-type impurity ions into silicon substrate 600a. Impurity region 603a is formed by implanting p-type impurity ions into silicon substrate 600a.

Interlayer insulation film 681 is formed to cover silicon substrate 600a. A resist 671 is applied on interlayer insulation film 681. A photo mask 674 with formed contact hole patterns is positioned on resist 671. Photo mask 674 is formed of glass 674a which is transparent to light and a metallic film 674b which is not transparent to light. Light is emitted from the direction denoted by arrow 675 to resist 671 through photo mask 674. Thus, the light passes though a portion of photo mask 674 without metallic film 674b and exposes the underlying resist, thereby causing an exposed portion 672.

Referring to FIGS. 24 and 25, exposed resist 671 is dipped in a developing solution. Thus, exposed portion 672 is removed to form a contact hole pattern.

Referring to FIGS. 20 and 21, interlayer insulation film 681 is selectively etched according to the resist with formed contact hole patterns, and thus contact holes 621, 622, 623, 624, 627, and 628 are formed. Pad electrodes 651a, 653a, 658a and storage nodes 652, 657 are formed to fill these contact holes. Interlayer insulation film 682 is formed on interlayer insulation film 681. Contact holes 682a, 682b, and 682c are formed in interlayer insulation film 682. Ground nodes 653, 658 are formed to fill contact holes 682a, 682b, and 682c, and at the same time bit lines 651, 656 are formed. The SRAM shown in FIGS. 20 and 21 is completed in this manner.

In the following, problems caused by the conventional manufacturing process will be described. FIGS. 26 to 31 are views for describing one problem caused by the conventional manufacturing process. Here, FIGS. 26, 28, and 30 correspond to the section shown in FIGS. 22 and 24 while FIGS. 27, 29, and 31 correspond to the section shown in FIGS. 23 and 25.

Referring to FIGS. 26 and 27, the resist is exposed by light which has passed through photo mask 674. The light passes through resist 671 and is irregularly reflected by underlying silicon substrate 600a, gate electrodes 661, 662, and so on. The surface of a gate electrode has a gate electrode protection film such as a refractory metal silicide film and a silicon nitride film, and therefore especially the surface easily causes irregular reflection. The resist is also exposed by the irregularly reflected light.

As semiconductor devices are miniaturized and their contact holes come to have a diameter of 0.3 $\mu$m and an interval of 0.5 $\mu$m or less between them, light energy for exposing a resist becomes higher.

If some region has a smaller distance between contact holes compared with other regions, light emitted to a portion for forming a contact hole is reflected by silicon substrate 600a, gate electrodes 611, 622, and the like in the region. Thus, portions 672a, 672b which should not be exposed are eventually exposed. As a result, two adjacent exposed portions 672 are connected.

Referring to FIGS. 28 and 29, when the resist is developed, not only exposed portion 672 which should be exposed but portions 672a, 672b which should have the remaining resist are developed and stripped of the resist. Thus, resist 671 does not exist even in a portion without any contact hole formed.

Referring to FIGS. 30 and 31, when interlayer insulation film 681 is etched by using the above described resist as a mask, interlayer insulation film 681 is etched between contact holes 622 and 627 and between contact holes 621 and 622, thereby connecting two contact holes.

FIG. 32 is a view for describing another problem caused by the conventional manufacturing process. Referring to FIG. 32, when light 675 passes through photo mask 674, exposure is found not only immediately under a region without metallic film 674b but immediately under a region with metallic film 674b. This is caused by light diffraction (Fraunhofer diffraction).

If the distance between contact hole pattern openings 674c assumes a described value in photo mask 674 for contact holes, diffracted light beams which have passed through openings 674c may be overlapped. In this case, the intensity of the diffracted light beams corresponds to curve 698 plus curve 699 which indicate the intensity of secondary diffracted light as shown in FIG. 32. Therefore, this portion is also exposed intensely. As a result, not only exposed portion 672 which is to be exposed but portion 672c which is not to be exposed is exposed in resist 671. When the resist is developed, the resist is removed even in exposed portion 672c and a contact hole is formed in that portion by a subsequent process.

SUMMARY OF THE INVENTION

Therefore, the present invention was made to solve the above described problems.

One object of the present invention is to provide a static type semiconductor memory device and a semiconductor device in which adjacent holes cannot be connected and which can be miniaturized.

Another object of the present invention is to provide a semiconductor device in which another hole cannot be formed in an unexpected portion between adjacent holes and which can be miniaturized.

A static type semiconductor memory device according to one aspect of the present invention includes a semiconductor substrate having a conductive region, a gate electrode formed on the semiconductor substrate with a gate insulation film therebetween, and an interlayer insulation film covering the gate electrode. The interlayer insulation film has a plurality of first holes which reach the conductive region of the semiconductor substrate, and a plurality of second holes which reach the gate electrode. The plurality of first and second holes are formed to be positioned almost in a lattice manner.

In the static semiconductor memory device thus formed, the plurality of first and second holes are formed to be positioned almost in a lattice manner, and therefore the distance between these holes is almost constant and is not made partially smaller. Thus, even if light is irregularly reflected on the surface of the gate electrode or on the surface of the conductive region, adjacent holes are not connected and the static type semiconductor memory device can be miniaturized.

Preferably, the first holes are formed in a region surrounded by gate electrodes. Even in this case, adjacent holes are not connected and the static type semiconductor memory device can be miniaturized.

Preferably, the static type semiconductor memory device includes a memory cell. The memory cell includes a first driver transistor of a first conductivity type, a second driver transistor of the first conductivity type, a first load transistor of a second conductivity type, a second load transistor of the second conductivity type, a first access transistor of the first conductivity type, and a second access transistor of the first conductivity type.

The first driver transistor is connected to a first storage node through the first hole and connected to a ground node through the first hole, and has its gate electrode connected to a second storage node through the second hole.

The second driver transistor is connected to the second storage node through the first hole and connected to a ground node through the first hole, and has its gate electrode connected to the first storage node through the second hole.

The first load transistor is connected to the first storage node through the first hole and connected to a power supply node through the first hole, and has its gate electrode connected to the second storage node through the second hole.

The second load transistor is connected to the second storage node through the first hole and connected to the power supply node through the first hole, and has its gate electrode connected to the first storage node through the second hole.

The first access transistor is connected to the first storage node through the first hole and connected to one of paired bit lines through the first hole, and has its gate electrode connected to a word line.

The second access transistor is connected to the second storage node through the first hole and connected to the other of the paired bit lines through the first hole, and has its gate electrode connected to the word line.

In this case, in a "full CMOS type" static type semiconductor memory device having six transistors, adjacent holes are not connected even if light is irregularly reflected on the surface of the gate electrode or on the surface of the conductive region. Therefore, the memory cell can be miniaturized.

Preferably, the gate electrode includes first and second gate electrodes. The first gate electrode is shared by the first driver transistor of the first conductivity type and the first load transistor of the second conductivity type. The second gate electrode is shared by the second driver transistor of the first conductivity type and the second load transistor of the second conductivity type.

In this case, the first and second gate electrodes are shared respectively by two transistors, and therefore the full CMOS type static type semiconductor memory device can be miniaturized.

Preferably, the first and second holes are formed by exposure and development. If the wavelength of light used for exposure is $\lambda$ and the numerical aperture is NA, the distance d between the centers of a plurality of holes is a value which does not satisfy $1.64\times\lambda/NA$ or $1.16\times\lambda/NA$. In this case, formation of a hole in an unexpected portion between the plurality of holes can be prevented and the static type semiconductor memory device can be miniaturized.

A semiconductor device according to another aspect of the present invention includes a semiconductor substrate, a gate electrode formed on the semiconductor substrate with a gate insulation film therebetween, and a interlayer insulation film covering the gate electrode. The interlayer insulation film has a plurality of first holes which reach a conductive region of the semiconductor substrate, and a plurality of second holes which reach the gate electrode. The plurality of first and second holes are formed to be positioned almost in a lattice manner. Further, the semiconductor device includes a first conductive layer connected to the conductive region through the first hole and formed on the interlayer insulation film, and a second conductive layer connected to the gate electrode through the second hole and formed on the interlayer insulation film. The first and second conductive layers are formed almost at an identical height on the interlayer insulation film.

In the semiconductor device thus formed, the plurality of first and second holes are formed to be positioned almost in a lattice manner, and therefore the distance between adjacent holes is almost constant and is not made partially smaller. Even if light is irregularly reflected on the surface of the gate electrode or on the surface of the conductive region, therefore, adjacent holes are not connected and the semiconductor device can be miniaturized. Further, even if the first conductive layer and the second conductive layer are formed almost at the same height on the interlayer insulation film, adjacent holes are not connected in the semiconductor device. Further, the entire semiconductor device can be made smaller and planarer.

Preferably, the first and second conductive layers are an identical conductive layer.

Preferably, the first holes are formed in a region surrounded by gate electrodes. Even in this case, adjacent holes are not connected and the static type semiconductor memory device can be miniaturized.

Preferably, the first and second holes are formed by exposure and development. If the wavelength of light used for exposure is $\lambda$ and the numerical aperture is NA, the distance d between the centers of a plurality of holes is a value which does not satisfy $1.64\times\lambda/NA$ or $1.16\times\lambda/NA$. In this case, formation of a hole in an unexpected portion between the plurality of holes can be prevented and the semiconductor device can be miniaturized.

Preferably, the above described semiconductor device is a static type semiconductor memory device.

A semiconductor device according to still another aspect of the present invention includes a semiconductor substrate, and an interlayer insulation film formed on the semiconductor substrate. The interlayer insulation film has a plurality of holes formed by exposure and development. The plurality of holes are formed almost at lattice positions. The distance between adjacent holes is selected to prevent light intensification to a relatively high intensity between adjacent holes due to interference of diffraction of light which is emitted in exposure.

In the semiconductor device thus formed, the plurality of holes are formed almost at lattice positions, and therefore the distance between adjacent holes is almost constant and is not made partially smaller. Even if light is irregularly reflected on the surface of the gate electrode or on the surface of the conductive region, adjacent holes are not connected and the semiconductor device can be miniaturized.

Further, the distance between adjacent holes is selected to prevent light intensification to a relatively high intensity due to interference of diffraction of light which is emitted in exposure. Formation of a hole in an unexpected portion between adjacent holes can be prevented and the semiconductor device can be miniaturized.

If the wavelength of light used for exposure is $\lambda$ and the numerical aperture is NA, the distance d between the centers of a plurality of holes is a value which does not satisfy $1.64 \times \lambda/NA$ or $1.16 \times \lambda/NA$.

Light which has passed through a mask pattern for contact hole formation is also emitted to a portion, which is not to be exposed, by diffraction. This phenomenon is called the Fraunhofer diffraction which causes secondary and tertiary diffraction peaks in a portion which is not to be exposed.

Here, the peak of secondary diffracted light has the second highest intensity next to the peak of primary diffracted light in a portion where a hole is to be formed. If the peaks of secondary diffracted light from adjacent contact holes are met, the light beams which interfere with each other between the adjacent holes are intensified, which results in formation of a hole in an unexpected portion.

When the distance between two adjacent contact holes is $1.64 \times \lambda/NA$, the peaks of secondary diffracted light are met. When contact holes exist at each point of a square and the distance between them is $1.16 \times \lambda/NA$, secondary diffracted light beams are intensified with each other at the center of the four contact holes.

It is therefore necessary to set the distance between contact holes to a value other than the above described values. If a value other than the above described values is set, secondary diffracted light beams are not intensified with each other and formation of a contact hole in an unexpected portion can be prevented.

Preferably, the semiconductor device is a static type semiconductor memory device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
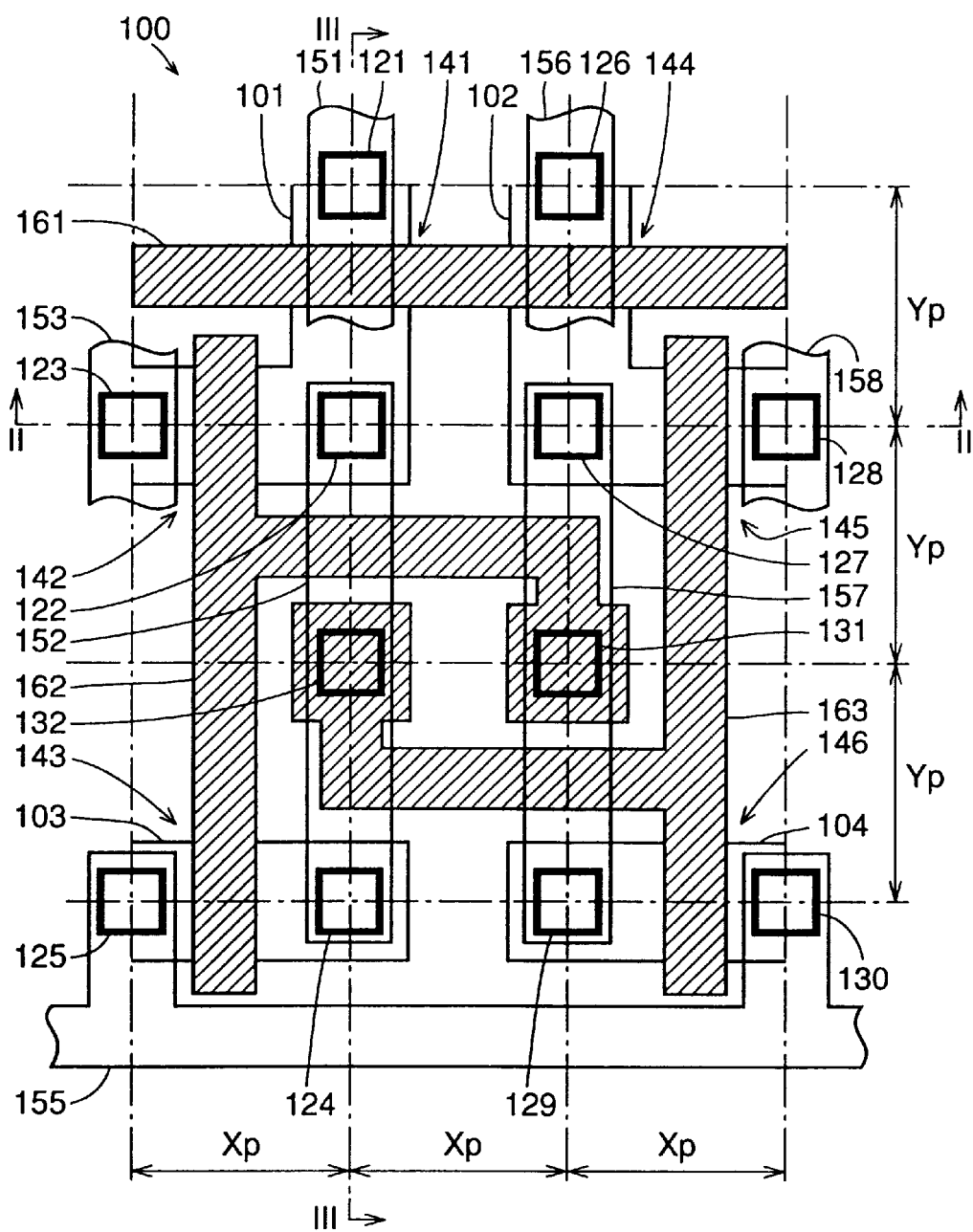
FIG. 1 is a plan view of an SRAM according to first and second embodiments of the present invention.

In the following, the embodiments of the present invention will be described with referring to the drawings.

First Embodiment

Referring to FIG. 1, a memory cell 100 of an SRAM according to first and second embodiments of the present invention includes n-type access transistors 141, 144, n-type driver transistors 142, 145, and p-type load transistors 143, 146.

Access transistor 141 has a pair of n-type impurity regions (source/drain regions) formed in an active region 101, and a gate electrode 161 formed between the pair of impurity regions. One of the impurity regions is connected to a bit line 151 through a contact hole 121 and the other is connected to a first storage node 152 through a contact hole 122. Gate electrode 161 is connected to a word line.

Access transistor 144 has a pair of n-type impurity regions (source/drain regions) formed in an active region 102, and gate electrode 161 formed between the pair of impurity regions. One of the impurity regions is connected to a bit line 156 through a contact hole 126 and the other is connected to a second storage node 157 through a contact hole 127. Gate electrode 161 is shared by two access transistors 141, 144. Further, gate electrode 161 extends almost perpendicularly to a pair of bit lines 151, 156.

Driver transistor 142 has a pair of impurity regions (source and drain regions) formed in active region 101, and a gate electrode 162 formed between the pair of impurity regions. The source region is connected to a ground node 153 through a contact hole 123 and the drain region is connected to first storage node 152 through contact hole 122. Gate electrode 162 is of a branch structure to be connected to second storage node 157, and is connected to second storage node 157 through a contact hole 131.

Driver transistor 145 has a pair of n-type impurity regions (source and drain regions) formed in active region 102, and a gate electrode 163 formed between the pair of impurity regions. The source region is connected to a ground node 158 through a contact hole 128 and the drain region is connected to second storage node 157 through contact hole 127. First storage node 152 and second storage node 157 are formed to be in parallel at a distance and to extend in one direction.

Load transistor 143 has a pair of p-type impurity regions (source and drain regions) formed in an active region 103, and gate electrode 162 formed between the pair of impurity regions. Load transistor 143 has its source region connected to a power supply node 155 through a contact hole 125, and its drain region connected to first storage node 152 through a contact hole 124. Gate electrode 162 is connected to second storage node 157 through a contact hole 131. Gate electrode 162 is shared by driver transistor 142 and load transistor 143.

Load transistor 146 has a pair of p-type impurity regions (source and drain regions) formed in an active region 104, and gate electrode 163 formed between the pair of impurity regions. Load transistor 146 has its source region connected to power supply node 155 through a contact hole 130, and its drain region connected to second storage node 157 through a contact hole 129. Gate electrode 163 is connected to first storage node 152 through a contact hole 132. Gate electrode 163 is shared by driver transistor 143 and load transistor 146.

All the contact holes shown in FIG. 1 have a diameter (length of one side) of about 0.2 μm. They are all provided almost at lattice positions. In the lateral direction in FIG. 1, the shortest distance (Xp) between adjacent contact holes is about 0.5 μm. In the longitudinal direction in FIG. 1, the shortest distance (Yp) between the centers of adjacent contact holes is 0.5 μm.

Contact holes 121 to 130 as first holes connect an interconnection layer to an active region of the silicon substrate surface. Contact holes 131, 132 as second holes connect a gate electrode to an interconnection layer formed thereon. If the wavelength of light used for exposure to form a contact hole is λ and the numerical aperture for exposure is NA, the distance between the centers of contact holes has a value which does not satisfy 1.64 λ/NA or 1.16×λ/NA.

One memory cell 100 shown in FIG. 1 is a "full CMOS" type memory cell which has six transistors. In the present invention, all contact holes are arranged at lattice positions, and therefore active regions and gate electrodes extend only in longitudinal and lateral directions in FIG. 1.

Contact holes 122 and 127 are formed in a region surrounded by gate electrodes 161, 162, and 163. Gate electrodes 161, 162, and 163 have a width of about 0.3 μm, and storage nodes 152, 157 have a width of about 0.35 μm.

Figure 2:
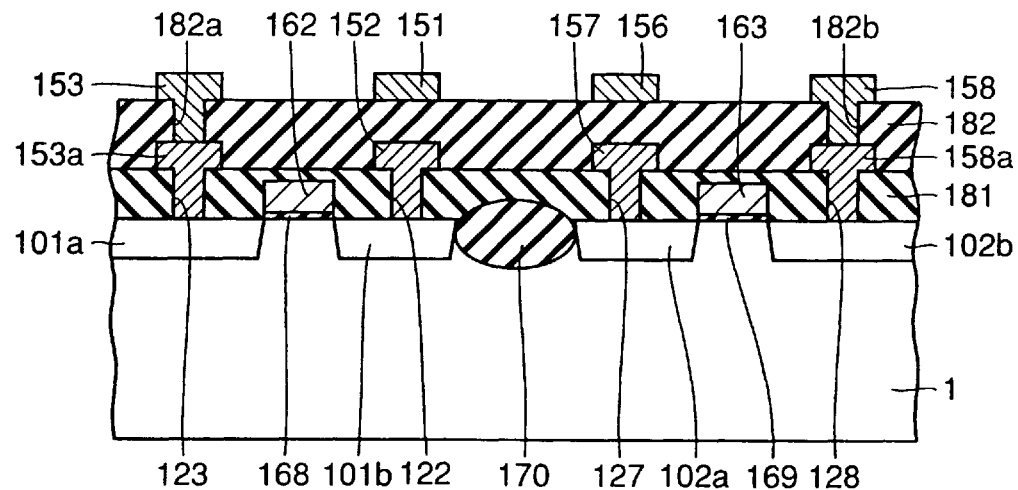
FIG. 2 shows a section along line II—II in FIG. 1.

Referring to FIG. 2, n-type impurity regions 101a, 101b, 102a, and 102b as conductive regions are formed at the surface of a silicon substrate 1. Impurity regions 101a, 101b are formed in active region 101 in FIG. 1. Impurity region 101a corresponds to the source region of driver transistor 142 while impurity region 101b corresponds to the drain region of driver transistor 142. It is noted that impurity regions 101a, 101b may be of an "LDD (Lightly Doped Drain)" structure which is formed of a high concentration impurity region and a low concentration impurity region.

Between impurity regions 101a and 101b, gate electrode 162 is formed on a gate oxide film 168 as a gate insulation film. Gate electrode 162 and impurity regions 101a, 101b form driver transistor 142.

An isolation oxide film 170 is formed at the surface of silicon substrate 1. A pair of n-type impurity regions 102a, 102b are formed at the surface of silicon substrate 1. Impurity regions 102a, 102b are formed in active region 102 in FIG. 1. Impurity region 102a corresponds to the drain region of driver transistor 145 while impurity region 102b corresponds to the source region of driver transistor 145. The pair of impurity regions 102a, 102b may be of an "LDD" structure similarly to impurity regions 101a, 101b. Between the pair of impurity regions 102a and 102b, gate electrode 163 is formed on a gate oxide film 169 as a gate insulation film.

On the surface of silicon substrate 1, an interlayer insulation film 181 is formed to cover gate electrodes 162, 163. In interlayer insulation film 181, contact holes 123, 122, 127, and 128 which reach impurity regions 101a, 101b, 102a, and 102b are formed.

Pad electrodes 153a, 158a are formed in contact holes 123, 128. To fill contact holes 122, 127, first storage node 152 and second storage node 157 which reach impurity regions 101b, 102a are formed.

An interlayer insulation film 182 is formed on interlayer insulation film 181. In interlayer insulation film 182, contact holes 182a, 182b which reach pad electrodes 153a, 158a are formed. Ground nodes 153, 158 are formed to fill contact holes 182a, 182b. Between ground nodes 153 and 158, bit lines 151, 156 are formed on the surface of interlayer insulation film 182.

Interlayer insulation films 181, 182 are formed of silicon oxide films doped with boron, phosphorus or the like. Isolation oxide film 170 is formed of a silicon oxide film which is prepared by thermally oxidizing silicon substrate 1. Gate oxide films 168, 169 are formed by thermally oxidizing the surface of silicon substrate 1. Gate electrodes 162, 163 are formed of the two layers of doped polysilicon and silicide. Pad electrodes 153a, 158a, first storage node 152, and second storage node 157 are formed of doped polysilicon. Bit lines 151, 156, and ground nodes 153, 158 are formed of aluminum.

Figure 3:
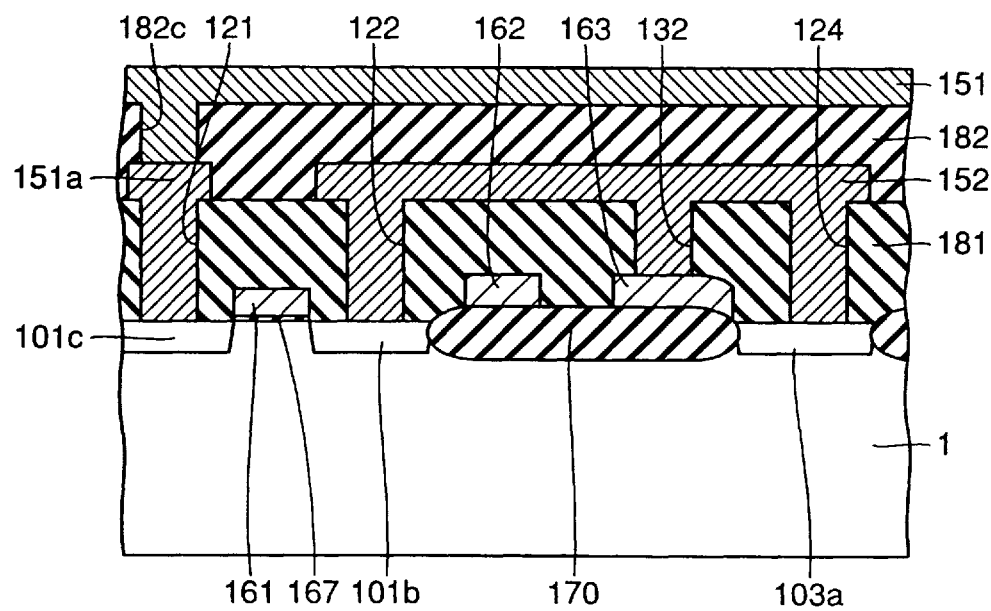
FIG. 3 shows a section along line III—III in FIG. 1.

Referring to FIG. 3, isolation oxide film 170 is formed like an island at the surface of silicon substrate 1. At the surface of silicon substrate 1, n-type impurity regions 101b, 101c and p-type impurity regions 103a as conductive regions are formed.

A pair of n-type impurity regions 101b, 101c are formed in active region 101 in FIG. 1. Impurity regions 101b, 101c correspond to the source/drain regions of access transistor 101. Impurity region 101c may also be of an "LDD" structure.

Gate electrodes 162, 163 are formed on isolation oxide film 170. Between two isolation oxide films 170, a p-type impurity region 103a as the drain region of load transistor 143 is formed. Impurity region 103a is formed in active region 103. Impurity region 103a may also be of an LDD structure.

To cover gate electrodes 161 to 163, interlayer insulation film 181 is formed on the surface of silicon substrate 1. In interlayer insulation film 181, contact holes 121, 122, 124 as first holes and contact hole 132 as a second hole are formed. Contact holes 121, 122, and 124 reach impurity regions 101c, 101b, and 103a as conductive regions. Contact hole 132 reaches gate electrode 163.

To fill contact holes 122, 132, and 124, first storage node 152 as first and second conductive layers is formed. The height of first storage node 152 is almost constant from the surface of silicon substrate 1. Pad electrode 151a is formed to fill the contact hole.

Interlayer insulation film 182 is formed to cover interlayer insulation film 181. In interlayer insulation film 182, a contact hole 182c which reaches pad electrode 151a is formed. Bit line 151 is formed to fill contact hole 182c.

Figure 4:
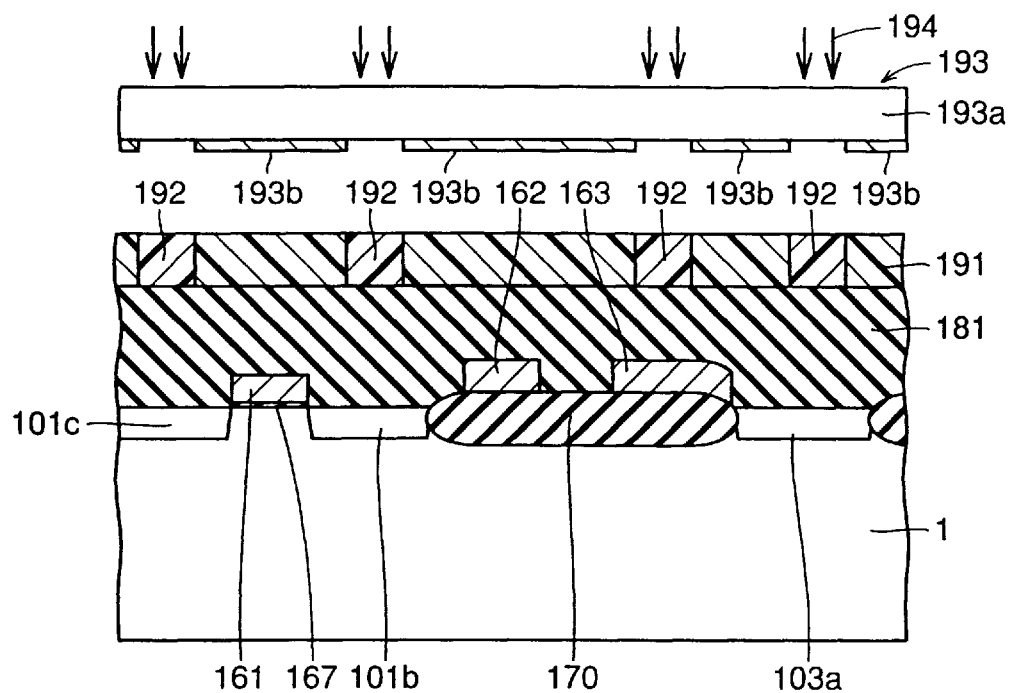
FIGS. 4 and 5 show first and second steps of a method of manufacturing the SRAM shown in FIGS. 1 to 3.
Figure 5:
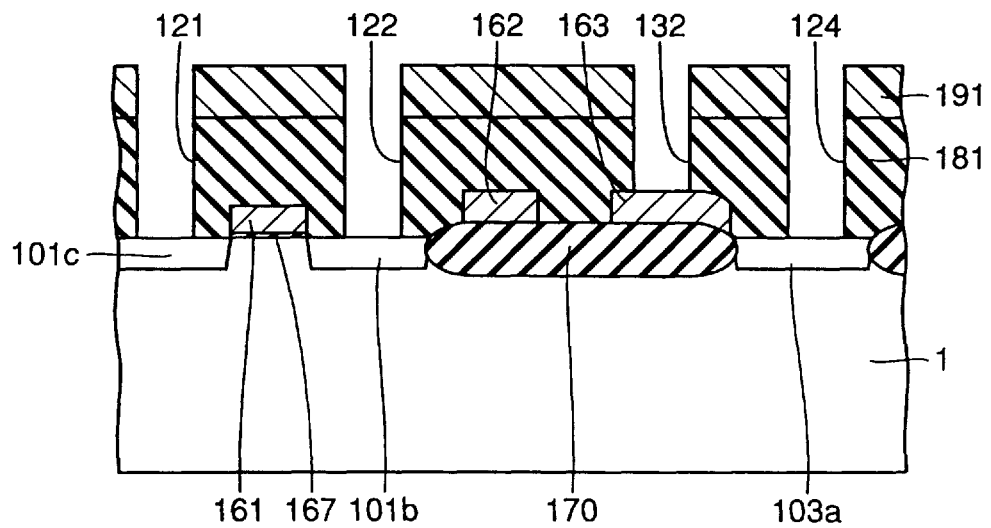

In the following, a method of manufacturing the SRAM shown in FIGS. 1 to 3 will be described with reference to FIGS. 4 and 5. FIGS. 4 and 5 correspond to the section shown in FIG. 3.

Referring to FIG. 4, isolation oxide film 170 is formed at the surface of silicon substrate 1. On silicon substrate 1, gate electrodes 161, 162, and 163 are formed with gate oxide film 167 therebetween. Impurity regions 101b, 101, and 101c are formed at the surface of silicon substrate 1. Interlayer insulation film 181 is formed to cover gate electrodes 161, 162, and 163. A resist is applied on the surface of interlayer insulation film 181.

A photo mask 193 is positioned on a resist 191. Photo mask 193 is formed of a glass substrate 193a and a metallic film 193b. If light is directed to photo mask 193 from the direction denoted by arrow 194, the light passes through a portion without metallic film 193b. The light which has passed through the portion is directed to resist 191, causing an exposed portion 192. If the wavelength for exposure is $\lambda$ and the numerical aperture is NA, the distance between adjacent exposed portions 192 is selected as a value which does not satisfy $1.64 \times \lambda / NA$ or $1.16 \times \lambda / NA$.

Referring to FIG. 5, exposed resist 191 is developed. Thus, exposed portions 192 are removed. Interlayer insulation film 181 is etched by using resist 191 as a mask. Thus, contact holes 121, 122, 132, and 124 are formed.

Referring to FIG. 3, pad electrode 151a is formed in contact hole 121. At same time, first storage node 152 is formed to cover contact holes 122, 132, and 124.

Interlayer insulation film 182 is formed to cover interlayer insulation film 181. In interlayer insulation film 182, contact hole 182c which reaches pad electrode 151a is formed. Bit line 151 is formed to fill contact hole 182a, and thus the SRAM shown in FIG. 3 is completed.

In such an SRAM, all the contact holes are formed at lattice positions as shown in FIG. 1, and therefore the distance between the contact holes are not made partially smaller. As a result, reflected light beams are not overlapped between the contact holes even if the light beams are reflected from the silicon substrate or the gate electrodes. Therefore, adjacent contact holes are not connected and the SRAM memory cell can be miniaturized.

Since the distance between the contact holes is a value (other than $1.64 \times \lambda / NA$ or $1.16 \times \lambda / NA$) which does not cause light beams to be intensified with each other by the Fraunhofer diffraction, a contact hole is not formed at an unexpected portion between adjacent contact holes by the Fraunhofer diffraction. Consequently, the SRAM can be miniaturized.

Even if the six transistors are miniaturized in a "full CMOS" type transistor which requires the six transistors as shown in FIG. 1, the contact holes are not connected. Thus, the reliability of the SRAM can be improved.

Second Embodiment

In a second embodiment, if the diameter of a contact hole (length of one side of a contact hole) is 2a in SRAM memory cell 100 shown in FIG. 1, longitudinal and lateral pitches are made Xp=na (n is a natural number over 1) and Yp=ma (m is a natural number over 1), respectively. The reason for such relations is as described below.

In exposure and development for contact hole formation, light beams from the ends of adjacent contact holes interfere with each other when exposing a resist. It is known by experience that the intensity of the interference light is determined by the distance from the end of a contact hole and the size of the contact hole. Therefore, the distance (pitch: Xp, Yp) between contact holes is made constant and the pitch is determined by multiplying the radius (a) of the contact hole by a natural number so as to make constant the interference of light beams for forming the contact holes. Thus, the exposure conditions in photolithography are made uniform for the contact holes and therefore the process conditions and the controllability are improved.

Third Embodiment

In the SRAM shown in FIG. 1, gate electrode 163 and first storage node 152 are connected between contact hole 122 and contact hole 124. In an SRAM memory cell 200 shown in FIG. 6, however, a first storage node 252 and a gate electrode 263 are connected through a contact hole 232 away from a portion between contact holes 122 and 124.

Correspondingly, the shape of gate electrode 263 is different from that of gate electrode 163. First storage node 252 is also longer than first storage node 152 shown in FIG. 1. The shape of a gate electrode 262 is also different from that of gate electrode 162 shown in FIG. 1.

Figure 6:
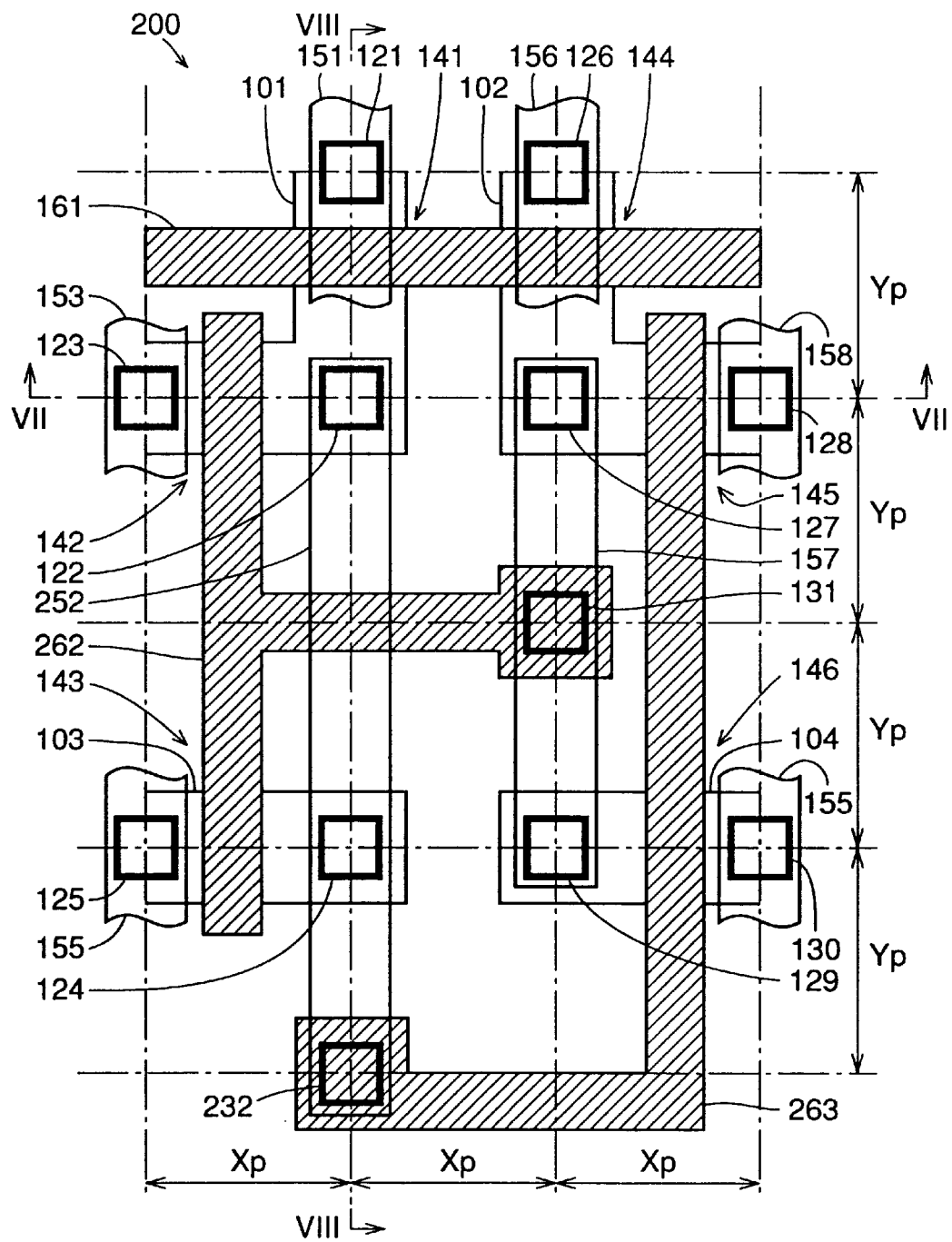
FIG. 6 is a plan view of an SRAM according to a third embodiment of the present invention.

In the memory cell shown in FIG. 6, contact holes 121 to 131 and 232 are also formed at lattice positions. The distance between the contact hole centers is Xp in the lateral direction and Yp in the longitudinal direction in FIG. 6.

If the wavelength of light used for exposure for contact hole formation is $\lambda$ and the numerical aperture for exposure is NA, the distance between the centers of the contact holes is set to a value which does not satisfy $1.64 \times \lambda / NA$ or $1.16 \times \lambda / NA$.

Figure 7:
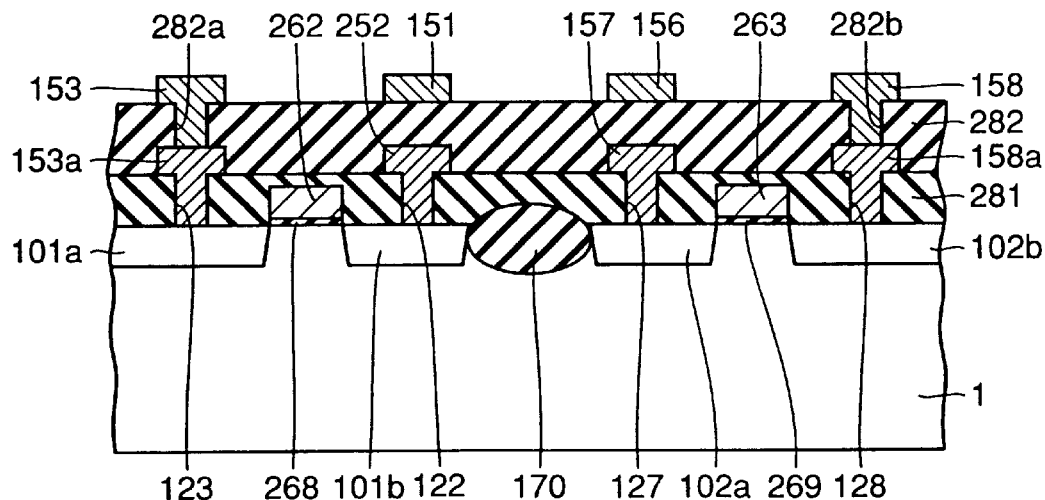
FIG. 7 shows a section along line VII—VII in FIG. 6.

Referring to FIG. 7, isolation oxide film 170 and impurity regions 101a, 101b, 102a, and 102b are formed at the surface of silicon substrate 1. On the surface of silicon substrate 1, gate electrodes 262, 263 are formed with gate oxide films 268, 269 therebetween.

An interlayer insulation film 281 is formed to cover the surface of silicon substrate 1. Contact holes 123, 122, 127, and 128 are formed in interlayer insulation film 281. To fill the contact holes, pad electrode 153a, 158a, a first storage node 252a, and a second storage node 157a are formed.

An interlayer insulation film 282 is formed to cover interlayer insulation film 281. In interlayer insulation film 282, contact holes 282a, 282b which reach pad electrodes 153a, 158a are formed. Ground nodes 153, 158 are formed to fill contact holes 282a, 282b. Bit lines 151, 156 are formed on the surface of interlayer insulation film 282.

Figure 8:
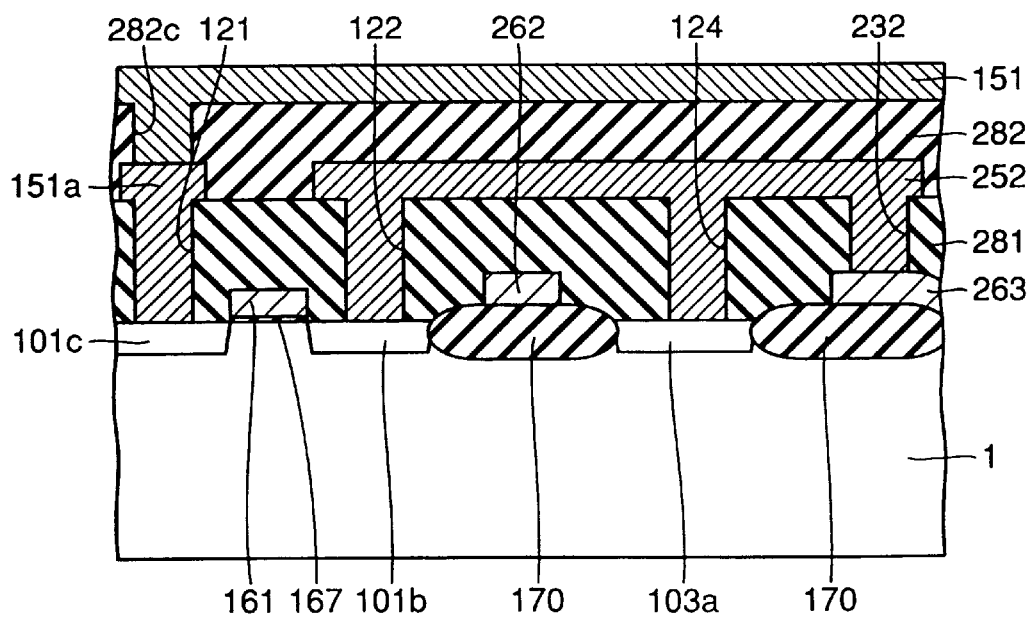
FIG. 8 shows a section along line VIII—VIII in FIG. 6.

Referring to FIG. 8, isolation oxide film 170 is formed at the surface of silicon substrate 1. Impurity regions 101b, 101c, and 103a are formed at the surface of silicon substrate 1. On the surface of silicon substrate 1, gate electrode 161 is formed with gate oxide film 167 therebetween. Gate electrode 262 is formed on isolation oxide film 170. Further, gate electrode 263 is formed on isolation oxide film 170.

Interlayer insulation film 281 is formed to cover silicon substrate 1. In interlayer insulation film 281, contact holes 121, 122, 124 as well as contact hole 232 as a second hole which reaches gate electrode 263 are formed. Pad electrode 151a is formed to fill contact hole 121. First storage node 252 as first and second conductive layers is formed to fill contact holes 122, 124, and 232. The height of first storage node 252 from the surface of silicon substrate 1 is almost constant.

Interlayer insulation film 282 is formed to cover interlayer insulation film 281. In interlayer insulation film 282, a contact hole 282c which reaches pad electrode 151a is formed. Bit line 151 is formed to fill contact hole 282c.

Figure 9:
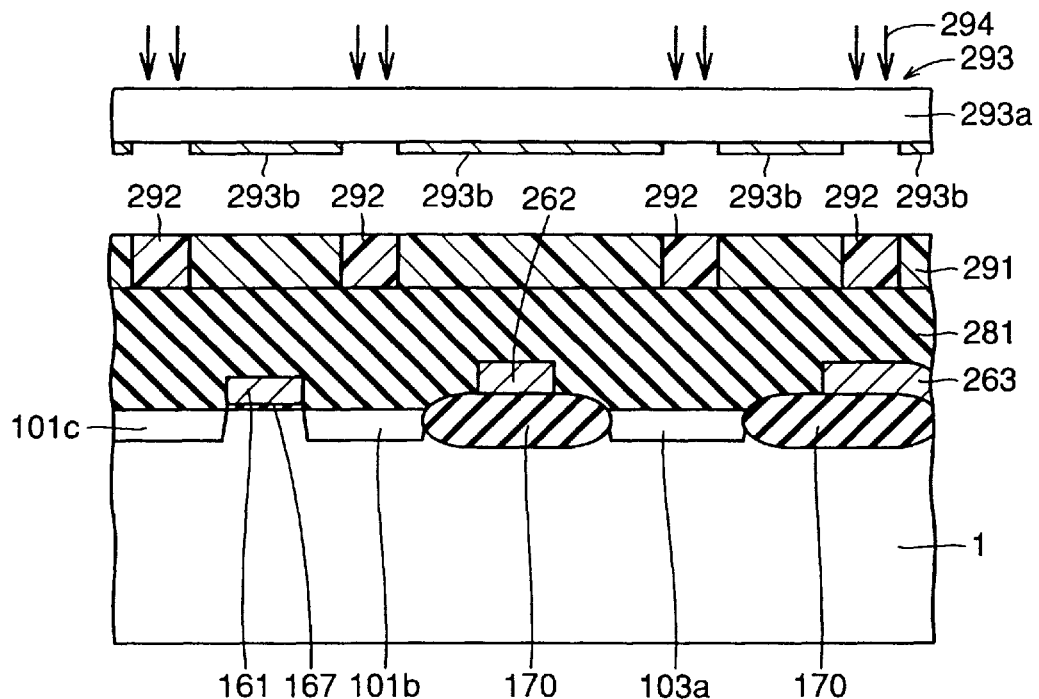
FIGS. 9 and 10 show first and second steps of a method of manufacturing the SRAM shown in FIGS. 6 to 8.
Figure 10:
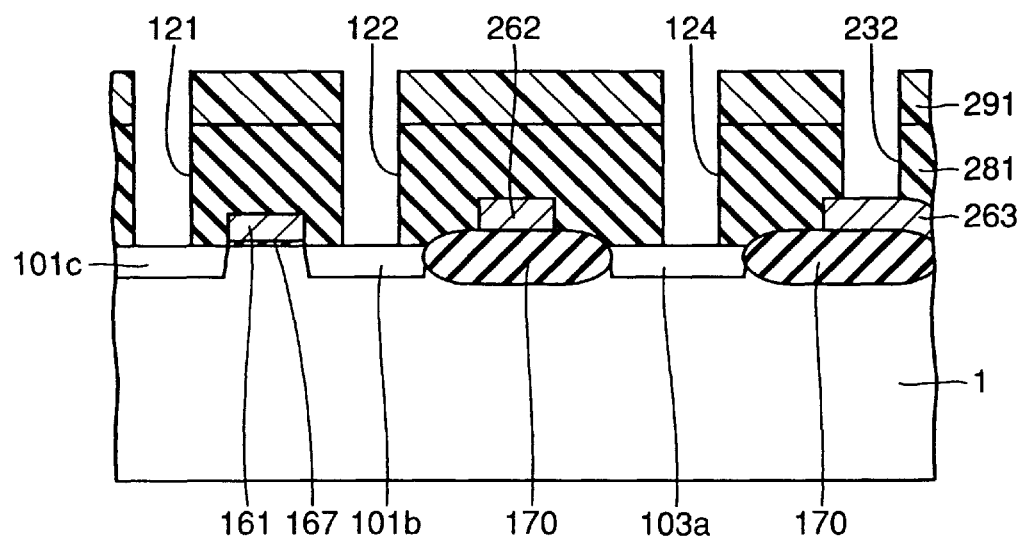

In the following, a method of manufacturing the SRAM memory cell shown in FIGS. 6 to 8 will be described. FIGS. 9 and 10 correspond to the section shown in FIG. 8.

Referring to FIG. 9, isolation oxide film 170 is formed at the surface of silicon substrate 1. On the surface of silicon substrate 1, gate electrode 161 is formed with gate oxide film 167 therebetween. Gate electrodes 262, 263 are formed on isolation oxide film 170. Impurity regions 101b, 101c, and 103a are formed at silicon substrate 1. Interlayer insulation film 281 is formed to cover silicon substrate 1. A resist 291 is applied on interlayer insulation film 281.

A photo mask 293 is positioned on resist 291. Photo mask 293 is formed of a glass substrate 293a and a metallic film 293b. Light is emitted to resist 291 through photo mask 293 form the direction denoted by arrow 294. Thus, resist 291 is exposed, causing exposed portion 292.

Referring to FIG. 10, resist 291 is developed. Thus, exposed portion 292 is removed. Interlayer insulation film 281 is etched according to the resist. Thus, contact holes 121, 122, 124, and 232 are formed.

Referring to FIG. 8, pad electrode 151a and first storage node 252 are formed. Interlayer insulation film 282 is formed to cover them. Contact hole 282c is formed in interlayer insulation film 282, and bit line 151 is formed to fill contact hole 282c. Thus, the SRAM shown in FIG. 8 is completed.

In such an SRAM, similar effects to those of the SRAM shown in the first embodiment are attained.

Fourth Embodiment

Figure 11:
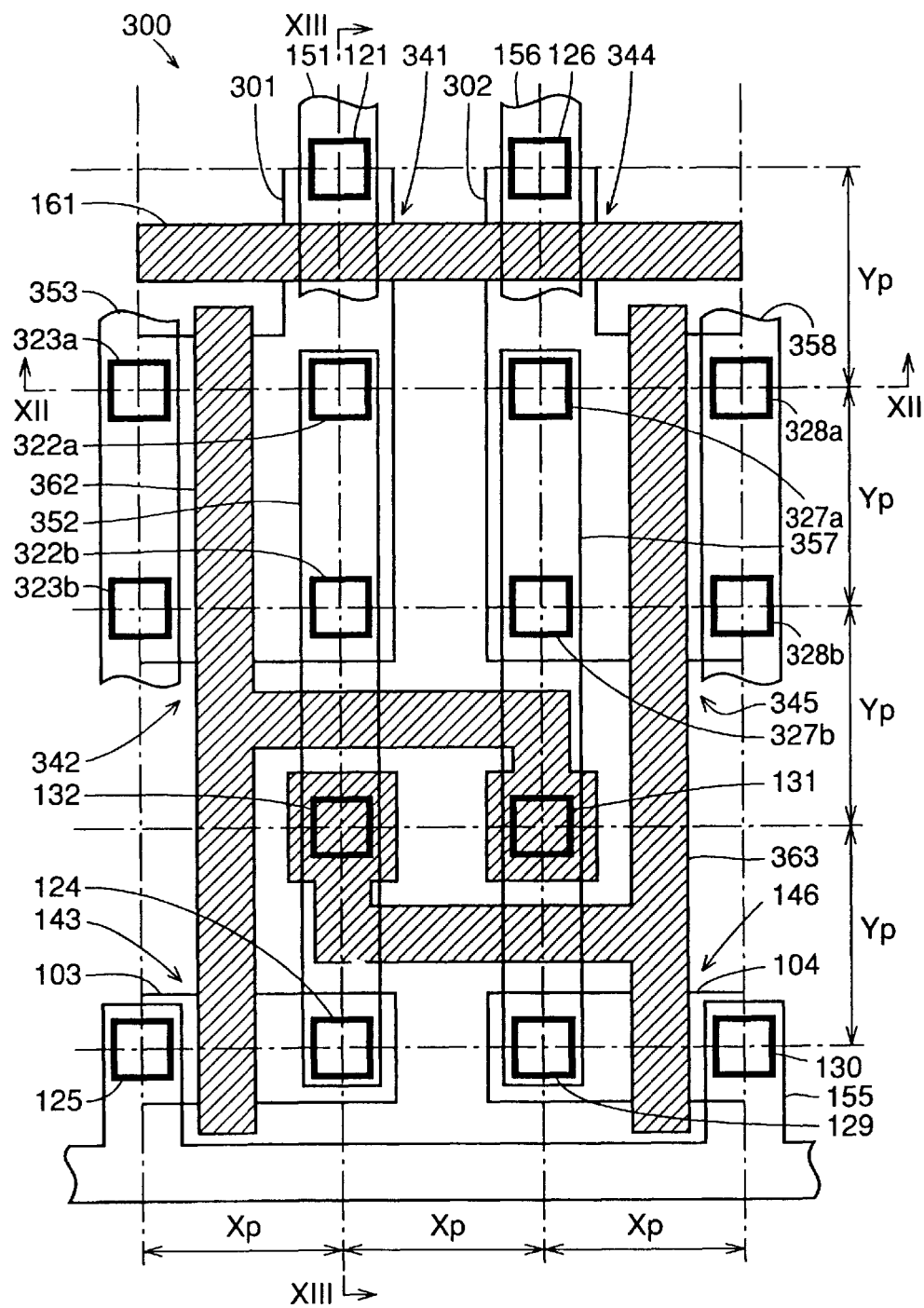
FIG. 11 is a plan view of an SRAM according to fourth and fifth embodiments of the present invention.

The SRAM according to fourth and fifth embodiments of the present invention shown in FIG. 11 is characterized in that the impurity regions of access transistors and driver transistors are wider than in FIG. 1. Thus, the transistor performance is improved.

Specifically, an SRAM memory cell 300 includes n-type access transistors 341, 344, n-type driver transistors 342, 345, and p-type load transistors 143, 146.

Access transistor 341 has a pair of n-type impurity regions (source/drain regions) formed in an active region 301, and gate electrode 161 formed between the impurity regions. One of the impurity regions is connected to bit line 151 through contact hole 121. The other is wider in plan area than the above described one and connected to a first storage node 352 through contact holes 322a, 322b.

Access transistor 344 has a pair of n-type impurity regions formed in an active region 302, and gate electrode 161 formed between the impurity regions. One of the impurity regions is connected to bit line 156 through contact hole 126. The other is larger in plan area than the above described one and connected to a second storage node 357 through contact holes 327a, 327b.

Driver transistor 342 has a pair of n-type impurity regions (source and drain regions) formed in active region 301, and gate electrode 362 formed between the pair of impurity regions. One (source region) of the impurity regions is connected to a ground node 353 through contact holes 323a, 323b. The other (drain region) of the impurity regions is connected to first storage node 352 through contact holes 322a, 322b. Gate electrode 362 is connected to second storage node 357 through contact hole 131.

Driver transistor 345 has a pair of n-type impurity regions (source and drain regions) formed in active region 302, and a gate electrode 363 formed between the pair of impurity regions. One (source region) of the impurity regions is connected to a ground node 358 through contact holes 328a, 328b. The other (drain region) of the impurity regions is connected to second storage node 357 through contact holes 327a and 327b. Gate electrode 363 is connected to first storage node 352 through contact hole 132.

Since load transistors 143, 146 are similar to the ones shown in FIG. 1, their description will not be repeated.

Figure 12:
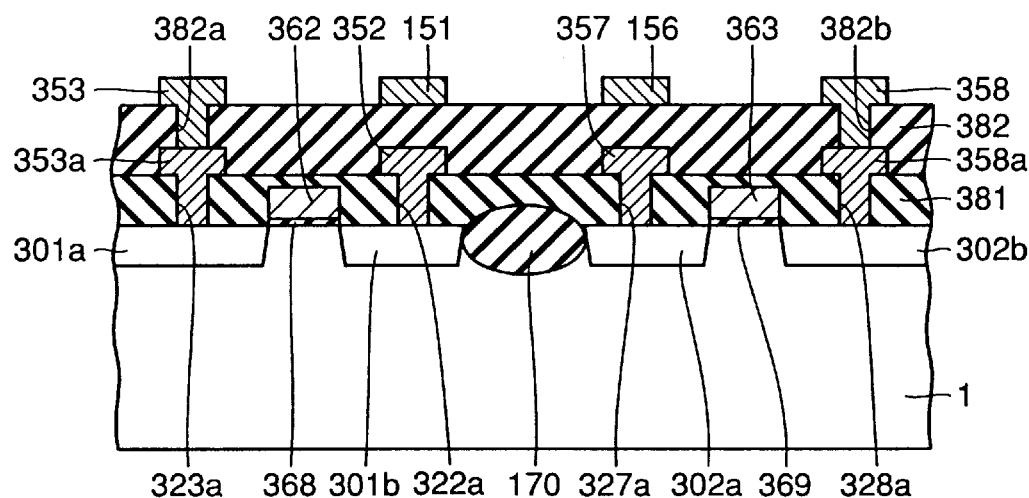
FIG. 12 shows a section along line XII—XII in FIG. 11.

Referring to FIG. 12, isolation oxide film 170 is formed at the surface of silicon substrate 1. At the surface of silicon substrate 1, n-type impurity regions 301a, 301b, 302a, and 302b as conductive regions are formed.

A pair of n-type impurity regions 301a, 301b are formed in active region 301 in FIG. 11. Impurity region 301a corresponds to the source region of driver transistor 342 while impurity region 301b corresponds to the chain region of driver transistor 342.

A pair of n-type impurity regions 302a, 302b are formed in active region 302 in FIG. 11. Impurity region 302a corresponds to the drain region of driver transistor 345 while impurity region 302b corresponds to the source region of driver transistor 345. On the surface of silicon substrate 1, gate electrodes 362, 363 are formed with gate oxide films 368, 369 as gate insulation films therebetween.

To cover gate electrodes 362, 363, an interlayer insulation film 381 is formed on the surface of silicon substrate 1. In interlayer insulation film 381, contact holes 323a, 322a, 327a, and 328a which reach impurity regions 301a, 301b, 302a, and 302b are formed. To fill the contact holes, a pad electrode 353a, first storage node 352, second storage node 357, and a pad electrode 358a are formed.

An interlayer insulation film 382 is formed to cover pad electrodes 353a, 358a, first storage node 352, and second storage node 357. In interlayer insulation film 382, contact holes 382a, 382b which reach pad electrodes 353a, 358a are formed. Ground nodes 353, 358 are formed to fill contact holes 382a, 382b. Bit lines 151, 156 are formed on interlayer insulation film 382.

Figure 13:
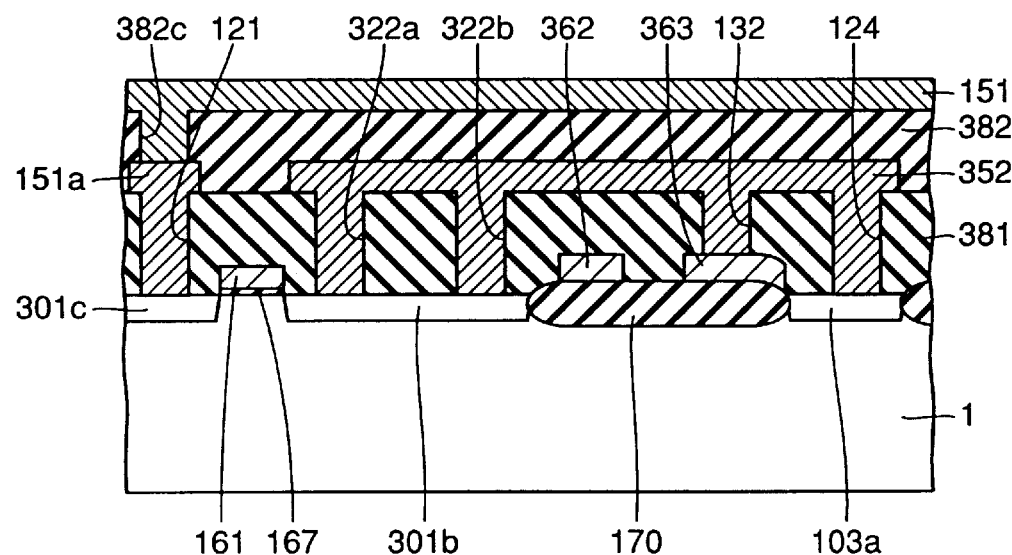
FIG. 13 shows a section along line XIII—XIII in FIG. 11.

Referring to FIG. 13, isolation oxide film 170 is formed at the surface of silicon substrate 1. At the surface of silicon substrate 1, n-type impurity regions 301b, 301c and p-type impurity region 103a as conductive regions are formed. Impurity regions 301b, 301c are in active region 301 in FIG. 11. Gate electrodes 362, 363 are formed on isolation oxide film 170. On silicon substrate 1, gate electrode 362 is formed with gate oxide film 368 therebetween.

To cover gate electrodes 362, 363, interlayer insulation film 382 is formed on silicon substrate 1. Impurity regions 301b, 301c may be of an LDD structure. Contact holes 121, 322a, 322b, 132, and 124 are formed in interlayer insulation film 381. Contact holes 322a, 322b, 121, and 124 as first holes reach impurity regions 301b, 301c, and 103a as conductive regions. Contact hole 132 as a second hole reaches gate electrode 363.

To fill contact hole 121, pad electrode 151a is formed. To fill contact holes 322a, 322b, 132, and 124, first storage node 352 as first and second conductive layers is formed. The height of first storage node 352 from the surface of silicon substrate 1 is almost constant.

Interlayer insulation film 382 is formed to cover interlayer insulation film 381. In interlayer insulation film 382, a contact hole 382c which reaches pad electrode 151 is formed. Bit line 151 is formed to fill contact hole 382c.

Figure 14:
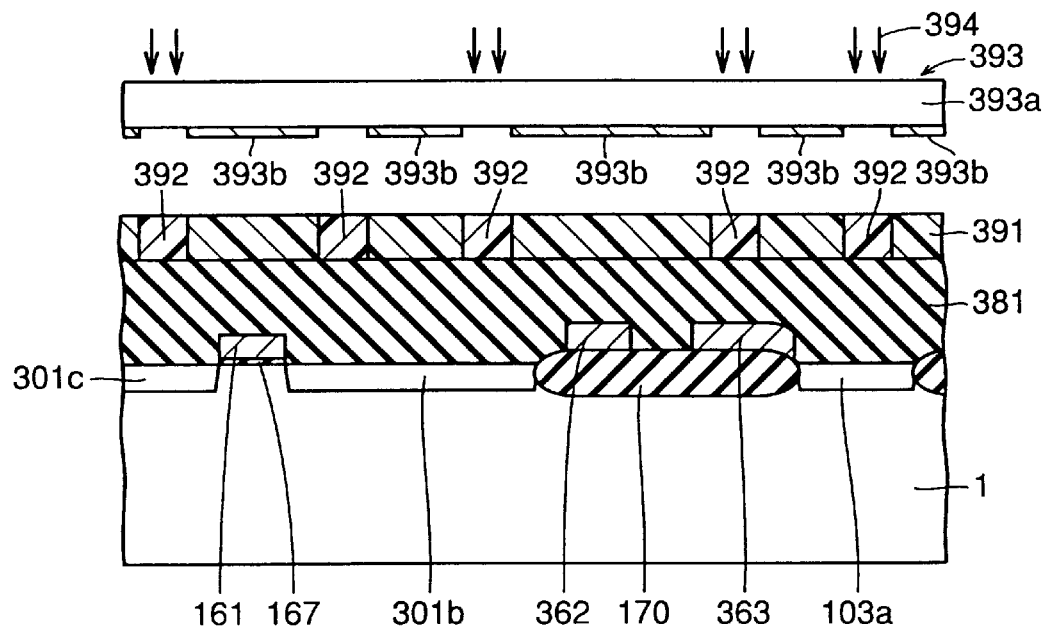
FIGS. 14 and 15 are sectional views showing first and second steps of a method of manufacturing the SRAM shown in FIGS. 11 to 13.
Figure 15:
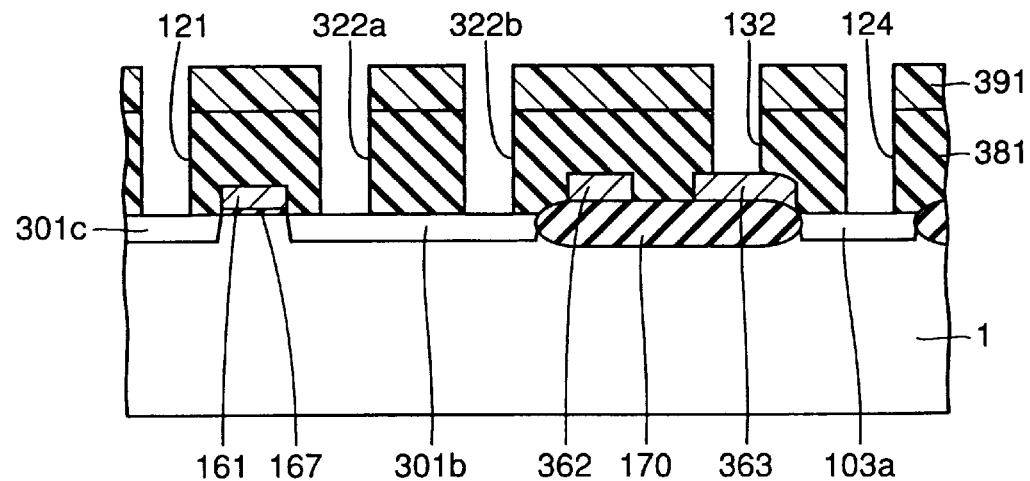

In the following, a method of manufacturing the SRAM shown in FIGS. 11 to 13 will be described. FIGS. 14 and 15 correspond to the section shown in FIG. 13.

Referring to FIG. 14, isolation oxide film 170 is formed at the surface of silicon substrate 1. On the surface of silicon substrate 1, gate electrode 161 is formed with gate oxide film 167 therebetween. Gate electrodes 362, 363 are formed on isolation oxide film 170.

Impurity regions 103a, 301b, and 301c are formed at the surface of silicon substrate 1. Interlayer insulation film 381 is formed to cover the surface of silicon substrate 1. A resist 391 is applied on the surface of interlayer insulation film 381. A photo mask 393 is positioned on resist 391. Photo mask 393 is formed of a glass member 393a and a metallic film 393b. If light is emitted from the direction denoted by arrow 394, resist 391 is partially exposed. Thus, an exposed portion 392 is caused.

Referring to FIG. 15, exposed resist 391 is developed. Thus, exposed portion 392 is removed. Interlayer insulation film 381 is etched by using resist 391 as a mask. Therefore, contact holes 121, 322a, 322b, 132, and 124 are formed.

Referring to FIG. 13, pad electrode 151a is formed to fill contact hole 121, and first storage node 352 is formed to fill contact holes 322a, 322b, 132, and 124. Interlayer insulation film 382 is formed to cover interlayer insulation film 381. Contact hole 382c is formed in interlayer insulation film 382, and contact hole 382c is filled with bit line 151. Thus, SRAM shown in FIG. 13 is completed.

In the SRAM thus formed, similar effects to those of the SRAM shown in the first embodiment are attained.

Since the plan area of impurity regions is larger and a plurality of contact holes are formed, the transistor performance is improved.

Fifth Embodiment

In a fifth embodiment, impurities are implanted into contact holes 323a, 323b, 322a, 322b, 327a, 327b, 328a, and 328b after they are formed in the fourth embodiment. The impurities are diffused by heating after implantation so that the impurity region which is formed by implantation into contact hole 323a is connected to the impurity region which is formed by implantation into contact hole 323b. Further, the impurity region which is formed by implantation into contact hole 322a is connected to the impurity region which is formed by implantation into contact hole 322b, the impurity region formed by implantation into contact hole 327a is connected to the impurity region formed by implantation into contact hole 327b, and the impurity region formed by implantation into contact hole 328a is connected to the impurity region formed by implantation into contact hole 328b.

In such an SRAM according to this embodiment, similar effects to those of the first embodiment are also attained.

Sixth Embodiment

Figure 16:
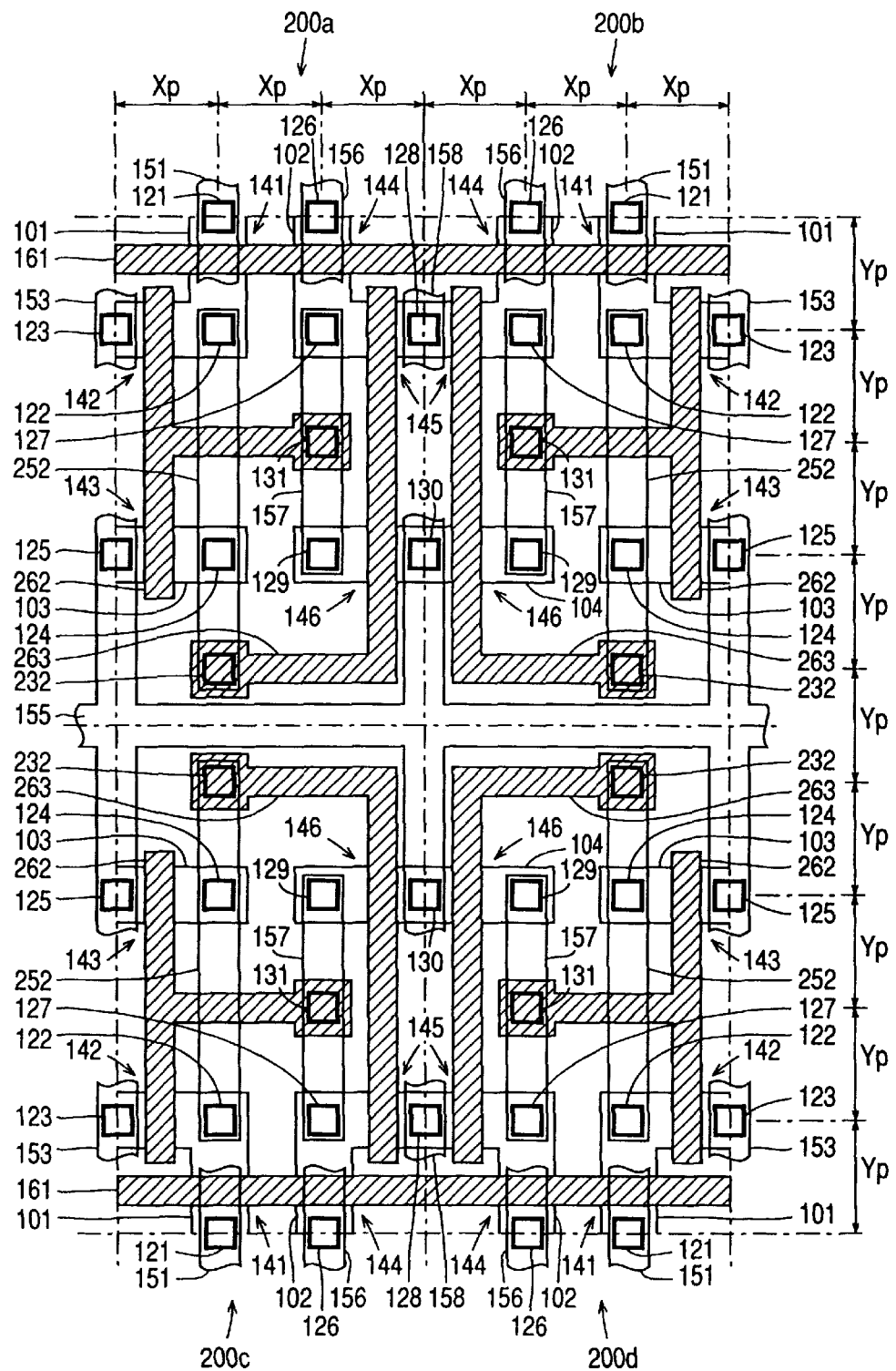
FIG. 16 is a plan view of an SRAM according to a sixth embodiment of the present invention.

In FIG. 16, memory cells 200a, 200b, 200c, and 200d which have the same structure as memory cell 200 shown in FIG. 6 are combined to form an SRAM memory cell. In this case as well, the minimum unit memory cells are arranged so that contact holes in the memory cells are arranged almost in a lattice manner and the pitch between the contact holes are constant. FIG. 16 shows an example in which the minimum unit memory cells are arranged symmetrically about the longitudinal and lateral axes.

Seventh Embodiment

In the above described sixth embodiment, the minimum unit memory cells are arranged symmetrically about the longitudinal and lateral axes. In this case, contact holes are formed close to each other, and the density of contact holes per unit area is different from that of the sixth embodiment.

Figure 17:
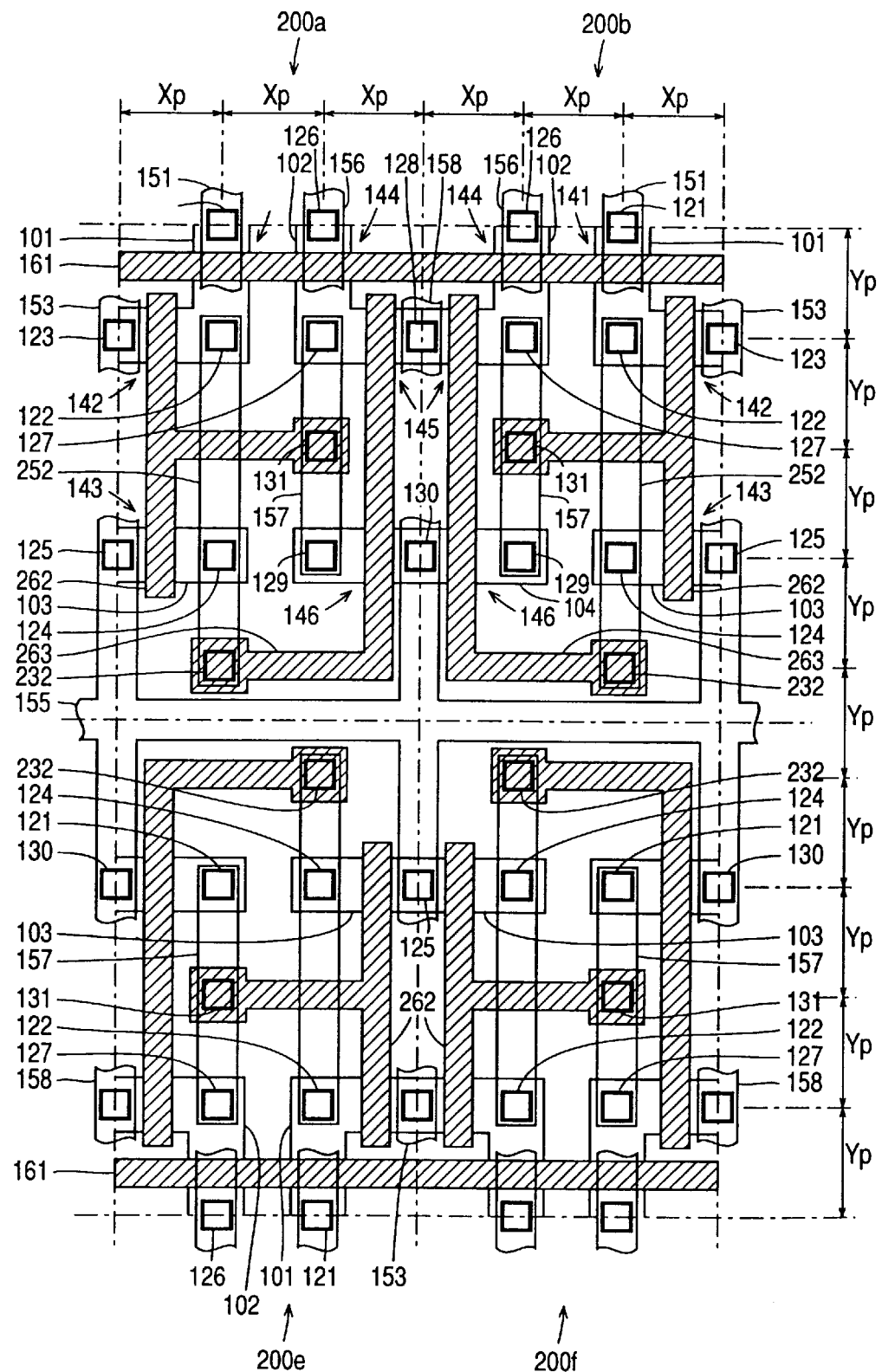
FIG. 17 is a plan view of an SRAM according to a seventh embodiment of the present invention.
Figure 18:
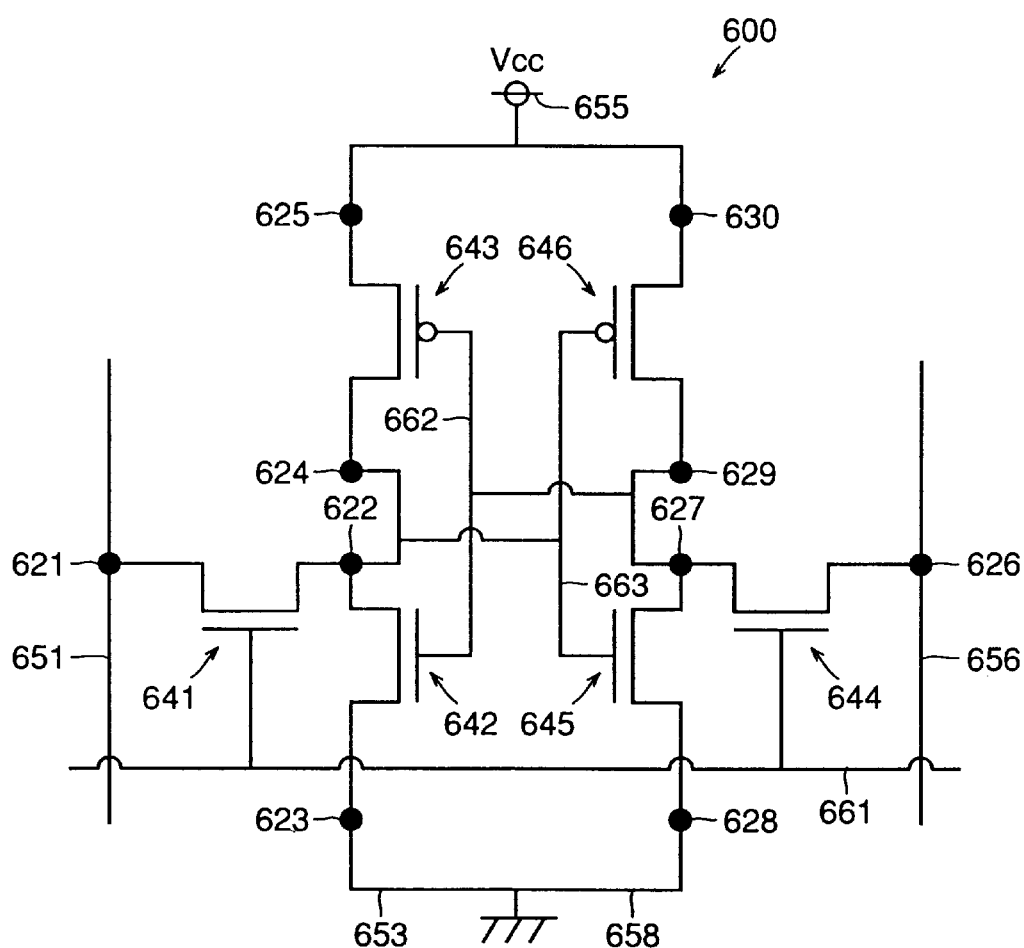
FIG. 18 is an equivalent circuit diagram of a conventional SRAM.
Figure 19:
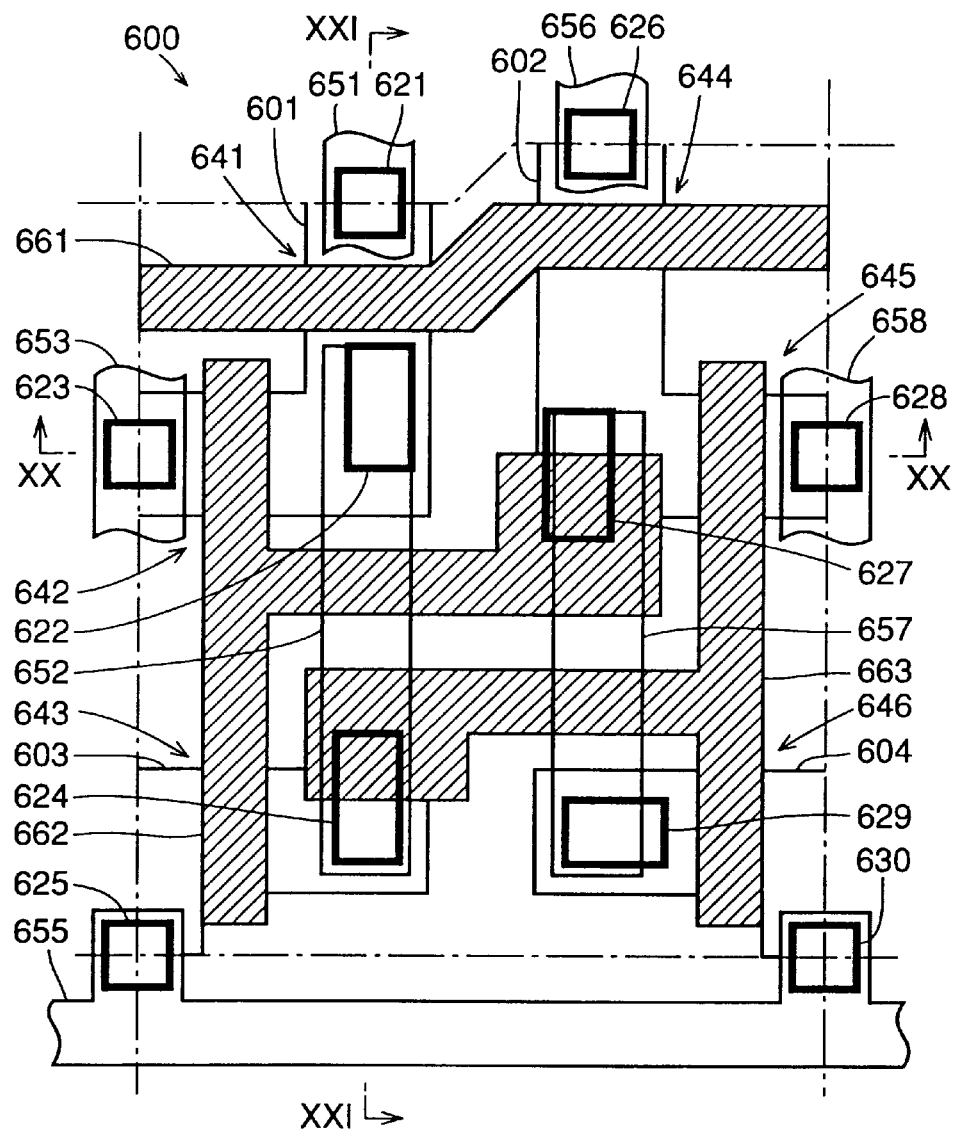
FIG. 19 is a plan view of the conventional SRAM.
Figure 20:
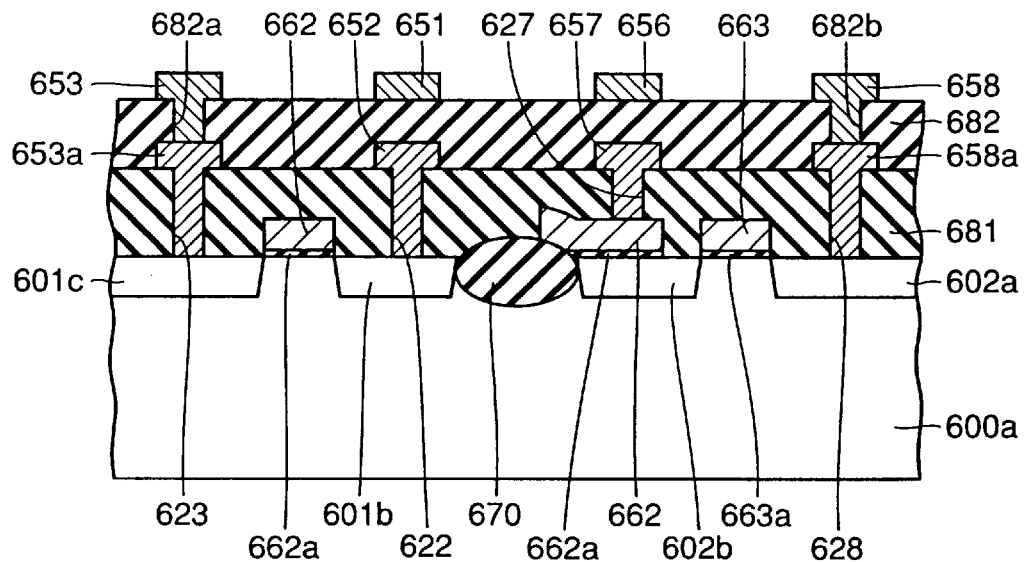
FIG. 20 shows a section along line XX—XX in FIG. 19.
Figure 21:
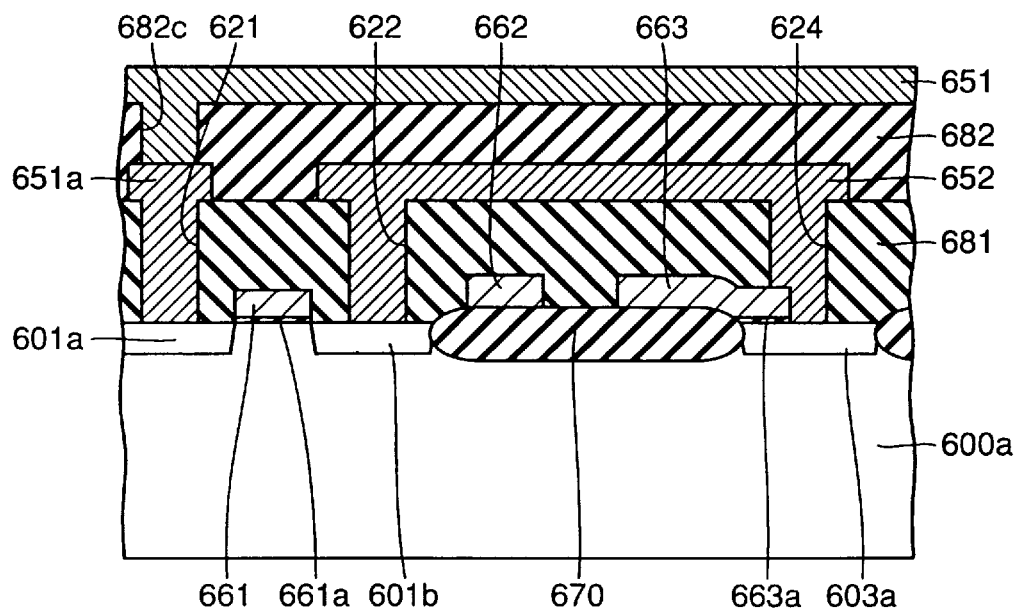
FIG. 21 shows a section along line XXI—XXI in FIG. 19.
Figure 22:
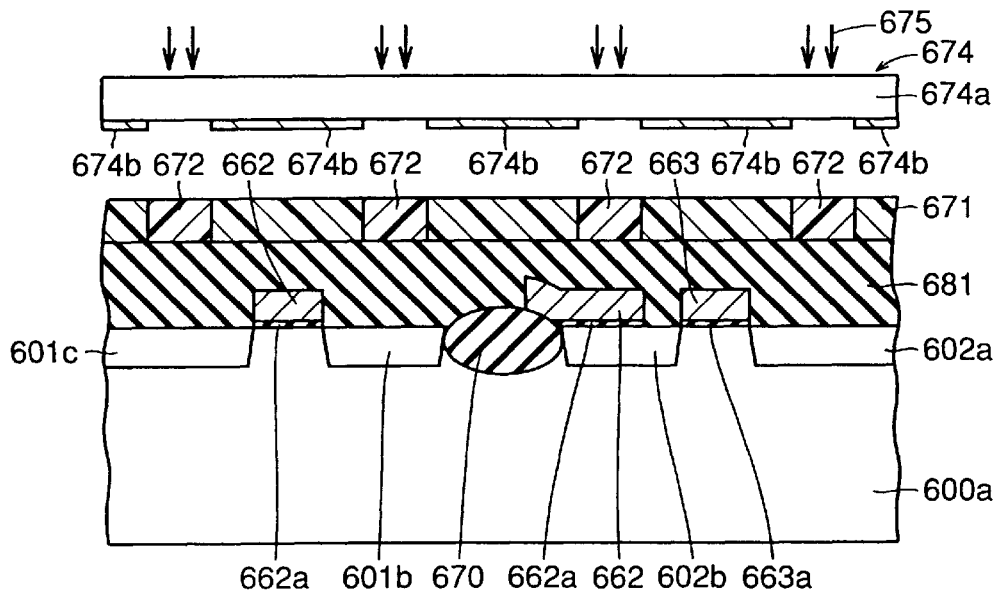
FIGS. 22 and 23 are sectional views showing a first step of a method of manufacturing the SRAM shown in FIGS. 19 to 21.
Figure 23:
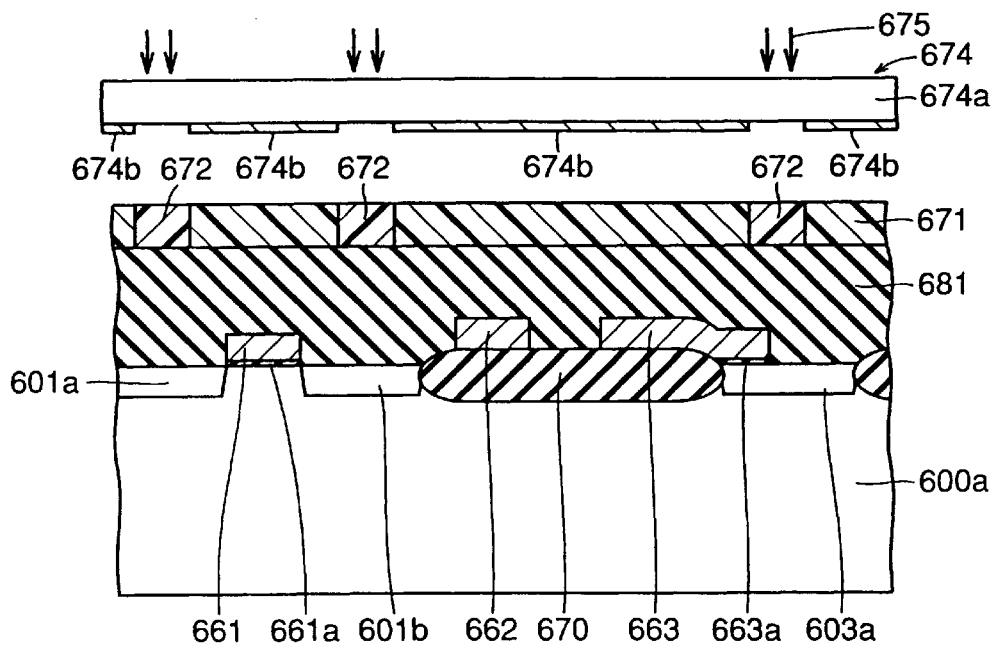
Figure 24:
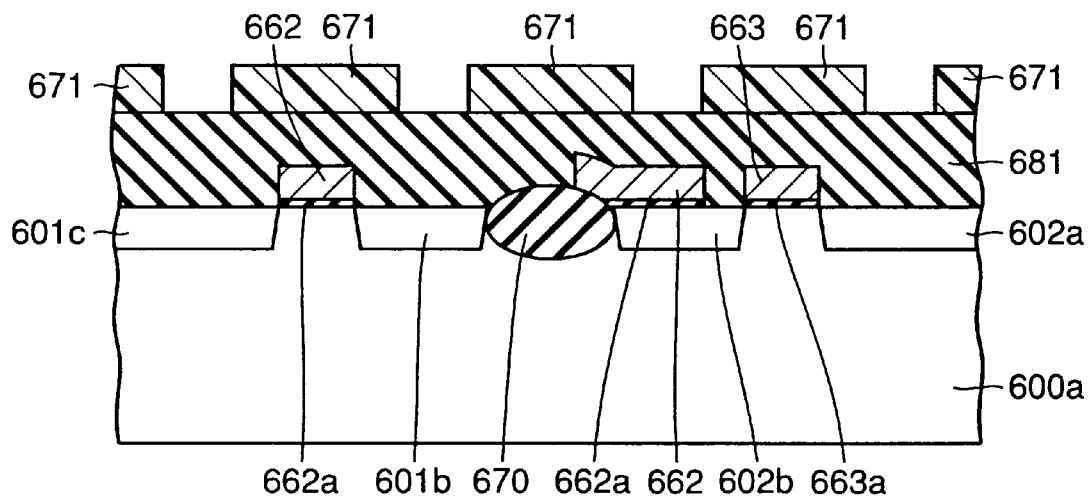
FIGS. 24 and 25 are sectional views showing a second step of the method of manufacturing the SRAM shown in FIGS. 19 to 21.
Figure 25:
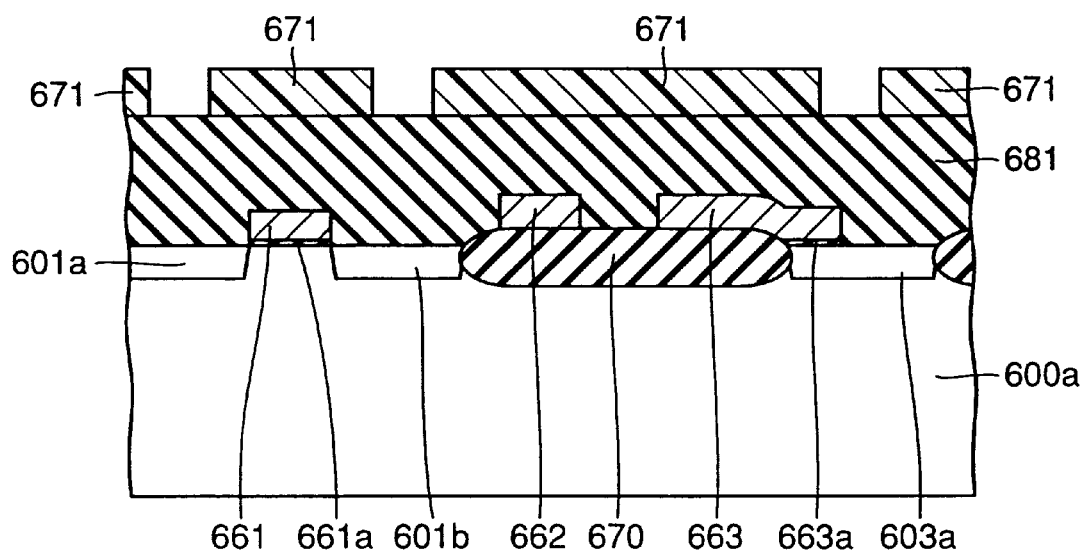
Figure 26:
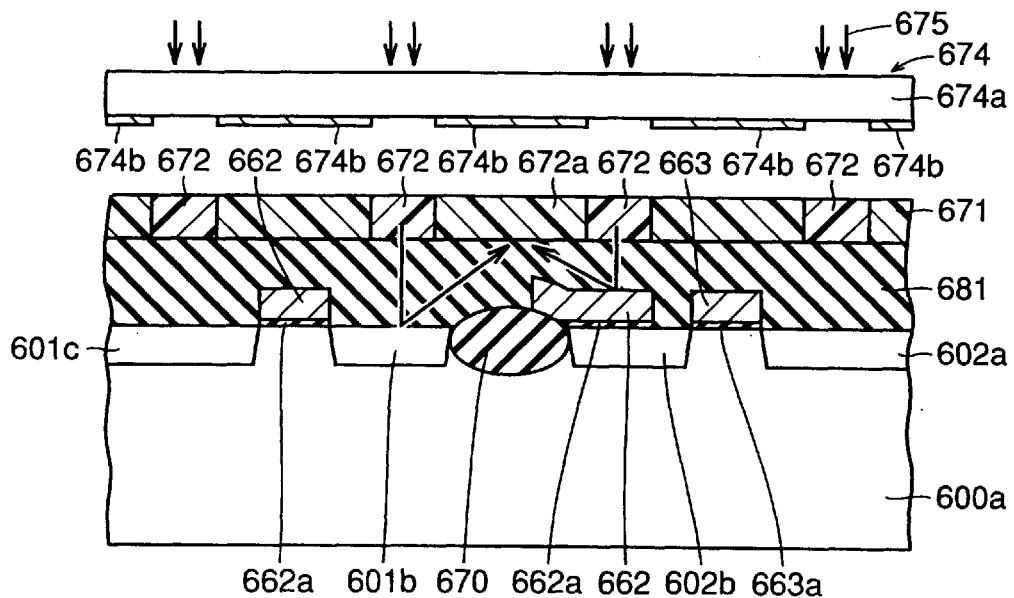
FIGS. 26 and 27 are sectional views for illustrating a resist which is exposed by reflected light.
Figure 27:
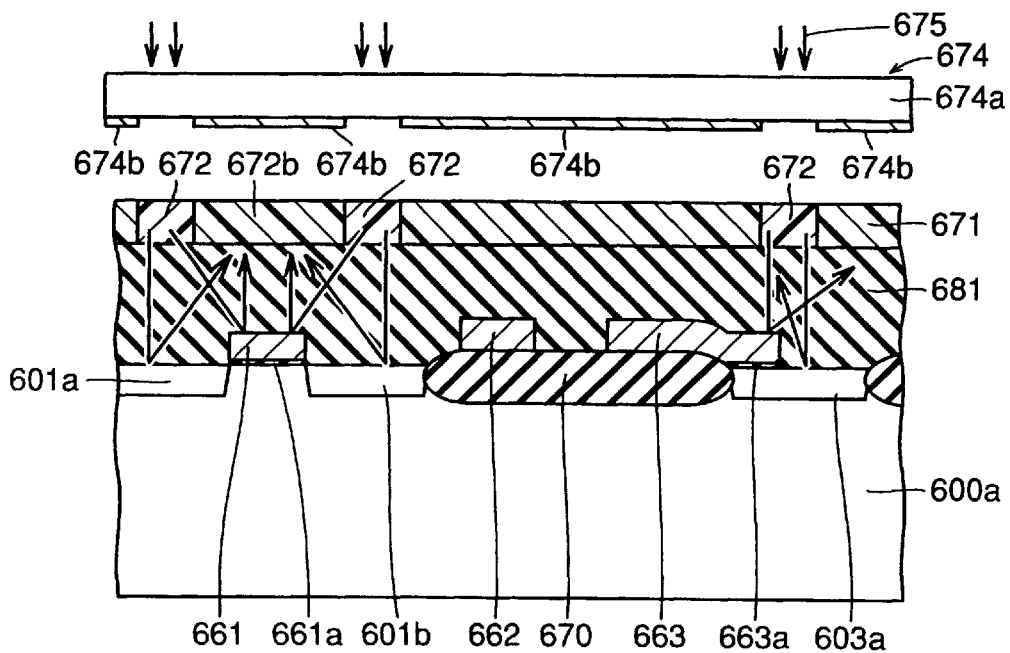
Figure 28:
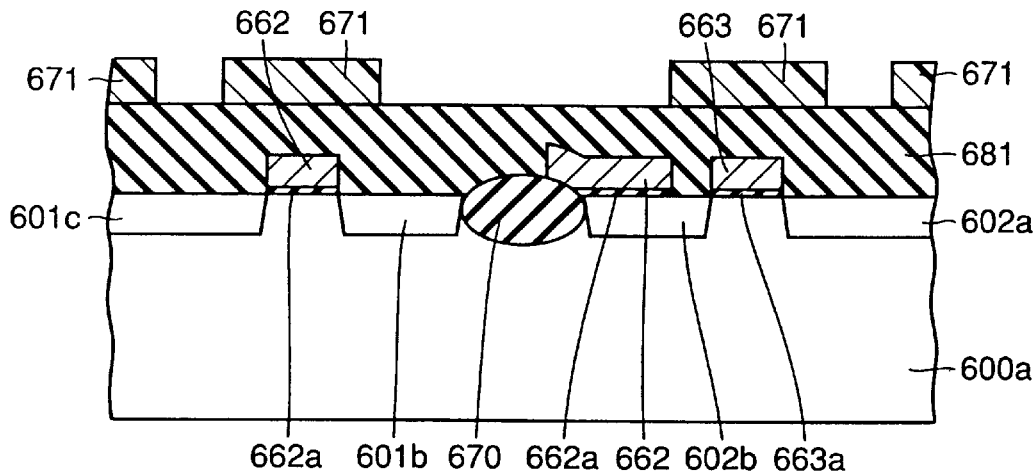
FIG. 28 is a sectional view for illustrating a pattern which is obtained by developing the resist shown in FIG. 26.
Figure 29:
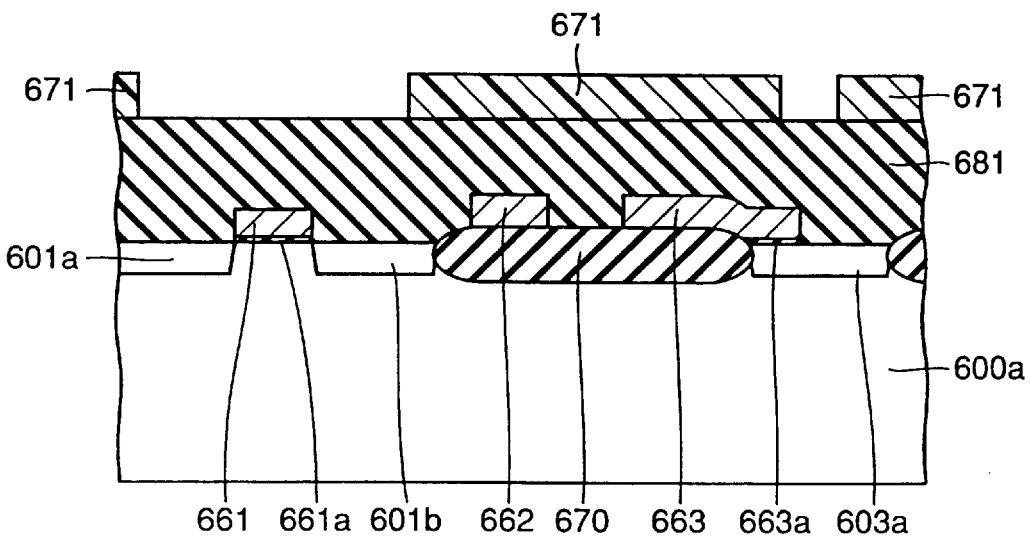
FIG. 29 is a sectional view for illustrating a pattern which is obtained by developing the resist shown in FIG. 27.
Figure 30:
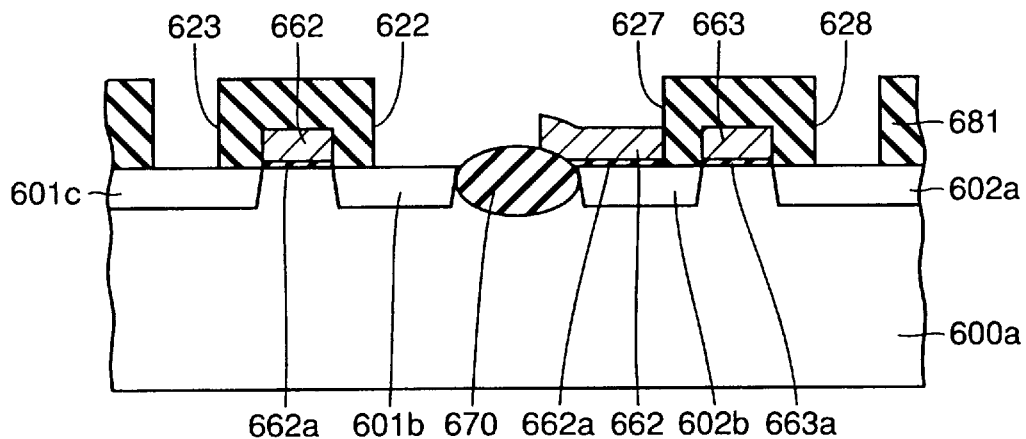
FIG. 30 is a sectional view for illustrating an interlayer insulation film which is etched according to the pattern shown in FIG. 28.
Figure 31:
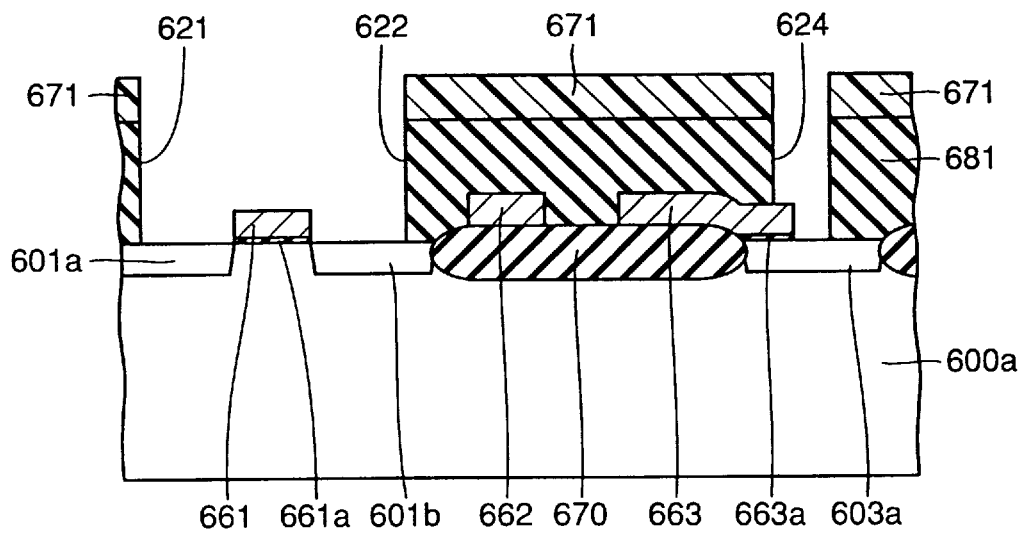
FIG. 31 is a sectional view for illustrating an interlayer insulation film which is etched according to the pattern shown in FIG. 29.
Figure 32:
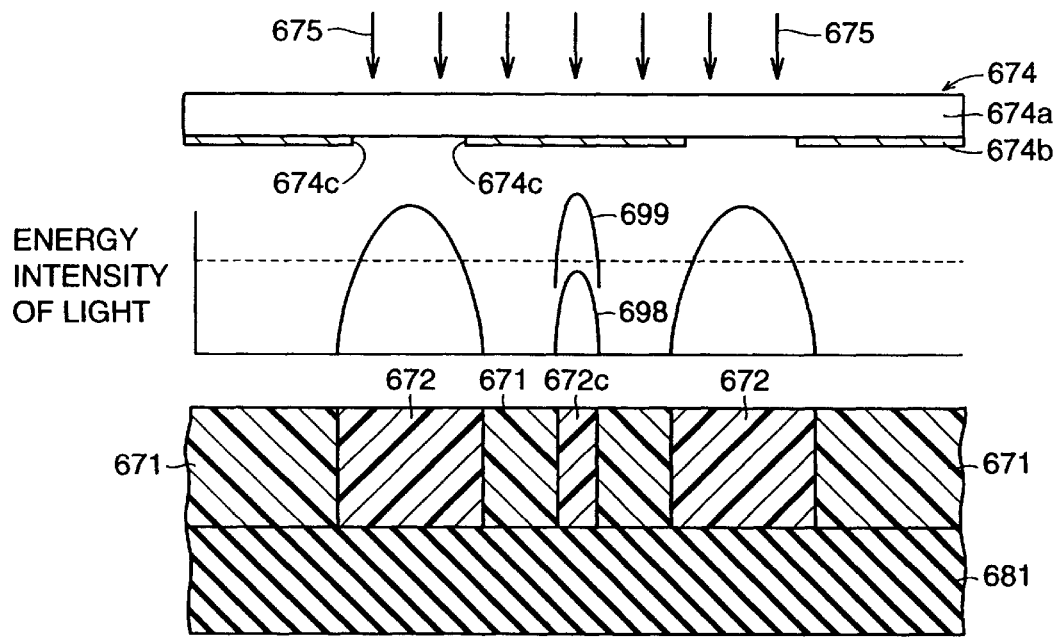
FIG. 32 is a view for illustrating the light diffraction phenomenon.

In a memory cell according to a seventh embodiment shown in FIG. 17, the minimum unit memory cells 200a, 200b, 200e, and 200f are arranged symmetrically about the longitudinal axis. In FIG. 17, therefore, memory cells 200a, 200b are arranged similarly to the case of FIG. 16 while memory cells 200e, 200f are arranged by exchanging memory cells 200c, 200d in FIG. 16.

Thus, contact holes which are close to each other on the same longitudinal axis do not exit, and the density of contact holes per unit area is constant.

The embodiments of the present invention have been described in the foregoing. However, the embodiments described herein can be modified in various manners. Although SRAM memory cells have been described in the embodiments, a circuit patterning portion in which contact holes are arranged at a density similar to that of memory cells in a circuit adjacent to the memory cell can attain similar effects by arranging similar contact holes in a lattice manner.

The present invention can be applied not only to an SRAM but a dynamic type random access memory or a nonvolatile semiconductor memory device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A static type semiconductor memory device, comprising:

a semiconductor substrate having a conductive region;

a gate electrode formed on said semiconductor substrate with a gate insulation film therebetween; and an interlayer insulation film covering said gate electrode, said interlayer insulation film having a plurality of first holes which reach the conductive region of said semiconductor substrate and a plurality of second holes which reach said gate electrode, and said plurality of first holes and second holes being formed to be positioned almost in a lattice manner.

2. The static type semiconductor memory device according to claim 1, wherein said first holes are formed in a region surrounded by said gate electrodes.

3. The static type semiconductor memory device according to claim 1, comprising:

a memory cell, said memory cell including a first driver transistor of a first conductivity type connected to a first storage node through said first hole, connected to a ground node through said first hole, and having its gate electrode connected to a second storage node through said second hole, a second driver transistor of the first conductivity type connected to said second storage node through said first hole, connected to a ground node through said first hole, and having its gate electrode connected to said first storage node through said second hole, a first load transistor of a second conductivity type connected to said first storage node through said first hole, connected to a power supply node through said first hole, and having its gate electrode connected to said second storage node through said second hole, a second load transistor of the second conductivity type connected to said second storage node through said first hole, connected to said power supply node through said first hole, and having its gate electrode connected to said first storage node through said second hole, a first access transistor of the first conductivity type connected to said first storage node through said first hole, connected to one bit line of paired bit lines through said first hole, and having its gate electrode connected to a word line, and a second access transistor of the first conductivity type connected to said second storage node through said first hole, connected to another bit line of said paired bit lines through said first hole, and having its gate electrode connected to the word line.

4. The static type semiconductor memory device according to claim 1, wherein said gate electrode includes first and second gate electrodes, said first gate electrode is shared by a first driver transistor of a first conductivity type and a first load transistor of a second conductivity type, and said second gate electrode is shared by a second diver transistor of the first conductivity type and a second load transistor of the second conductivity type.

5. The static type semiconductor memory device according to claim 1, wherein said first and second holes are formed by exposure and development, and a distance d between centers of a plurality of said holes is a value which does not satisfy 1.64×λ/NA or 1.16×λ/NA in which λ is a wavelength of light used for said exposure and NA is a numerical aperture.

6. A semiconductor device, comprising:

a semiconductor substrate having a conductive region;

a gate electrode formed on said semiconductor substrate with a gate insulation film therebetween;

an interlayer insulation film covering said gate electrode, said interlayer insulation film having a plurality of first holes which reach the conductive region of said semiconductor substrate and a plurality of second holes which reach said gate electrode, said plurality of first holes and second holes being formed to be positioned almost in a lattice manner;

a first conductive layer connected to said conductive region through said first hole and formed on said interlayer insulation film; and a second conductive layer connected to said gate electrode through said second hole and formed on said interlayer insulation film, said first and second conductive layers being formed almost at an identical height on said interlayer insulation film.

7. The semiconductor device according to claim 6, wherein said first and second conductive layers are an identical conductive layer.

8. The semiconductor device according to claim 6, wherein said first hole is formed in a region surrounded by said gate electrodes.

9. The semiconductor device according to claim 6, wherein said first and second holes are formed by exposure and development, and a distance d between centers of a plurality of said holes is a value which does not satisfy 1.64×λ/NA or 1.16×λ/NA in which λ is a wavelength of light used for said exposure and NA is a numerical aperture.

10. The semiconductor device according to claim 6, wherein said semiconductor device is a static type semiconductor memory device.

11. A semiconductor device, comprising:

a semiconductor substrate; and an interlayer insulation film formed on said semiconductor substrate, said interlayer insulation film having a plurality of holes formed by exposure and development, said plurality of holes being formed almost at lattice positions, and a distance between adjacent said holes being selected to prevent light intensification to a relatively high intensity between adjacent said holes due to interference of diffraction of light emitted in said exposure.

12. The semiconductor device according to claim 11, wherein a distance d between centers of a plurality of said holes is a value which does not satisfy 1.64×λ/NA or 1.16×λ/NA in which λ is a wavelength of light used for said exposure and NA is a numerical aperture.

13. The semiconductor device according to claim 11, wherein the semiconductor device is a static type semiconductor memory device.

* * * * *